(12) United States Patent
Cotte

(10) Patent No.: US 9,951,935 B2
(45) Date of Patent: Apr. 24, 2018

(54) DISPLAY DEVICE

(71) Applicant: PA. COTTE Family Holding GmbH, Amberg (DE)

(72) Inventor: Pierre-Alain Cotte, Amberg (DE)

(73) Assignee: PA. COTTE FAMILY HOLDING GMBH, Amberg (DE)

( * ) Notice: Subject to any disclaimer, the term of this patent is extended or adjusted under 35 U.S.C. 154(b) by 0 days.

(21) Appl. No.: 15/119,628

(22) PCT Filed: Feb. 18, 2015

(86) PCT No.: PCT/EP2015/000355
§ 371 (c)(1),
(2) Date: Aug. 17, 2016

(87) PCT Pub. No.: WO2015/124292
PCT Pub. Date: Aug. 27, 2015

(65) Prior Publication Data
US 2017/0082273 A1    Mar. 23, 2017

(30) Foreign Application Priority Data

Feb. 19, 2014  (DE) .................. 10 2014 002 272
Jun. 30, 2014  (DE) .................. 10 2014 009 677
Dec. 3, 2014   (DE) .................. 10 2014 017 764

(51) Int. Cl.
*F21V 33/00*    (2006.01)
*F21V 23/00*    (2015.01)
(Continued)

(52) U.S. Cl.
CPC .............. *F21V 23/005* (2013.01); *F21V 5/04* (2013.01); *G02B 6/0006* (2013.01); *G02B 26/02* (2013.01);
(Continued)

(58) Field of Classification Search
USPC ......................................................... 362/97
See application file for complete search history.

(56) References Cited

U.S. PATENT DOCUMENTS 6,636,185 B1   10/2003   Spitzer et al.
7,576,915 B2    8/2009   Kurt
(Continued)

FOREIGN PATENT DOCUMENTS

JP         2008134318 A      6/2008
WO     WO 2013117760 A1 *   8/2013   .............. B41J 2/45

OTHER PUBLICATIONS

IPRP dated Aug. 23, 2016 from related PCT Application No. PCT/EP2015/000355, filed Feb. 18, 2015.

*Primary Examiner* — Matthew Mikels
(74) *Attorney, Agent, or Firm* — Abelman, Frayne & Schwab

(57) ABSTRACT

The invention relates to a display device (1) having a display area (2) consisting of non-illuminated areas (9) and illuminated areas (12), wherein the centroids of adjacent illuminated areas (12) are located at distances (11, 11.1) from each other which are smaller than the resolving power of a viewer (50), wherein preferably the proportion of the non-illuminated areas (9) in the entire display area (2) is more than 70%, and wherein the display device (1) has at least one functional element (40.1, 40.2, 40.3, 40.4).

25 Claims, 10 Drawing Sheets

Figure 1:
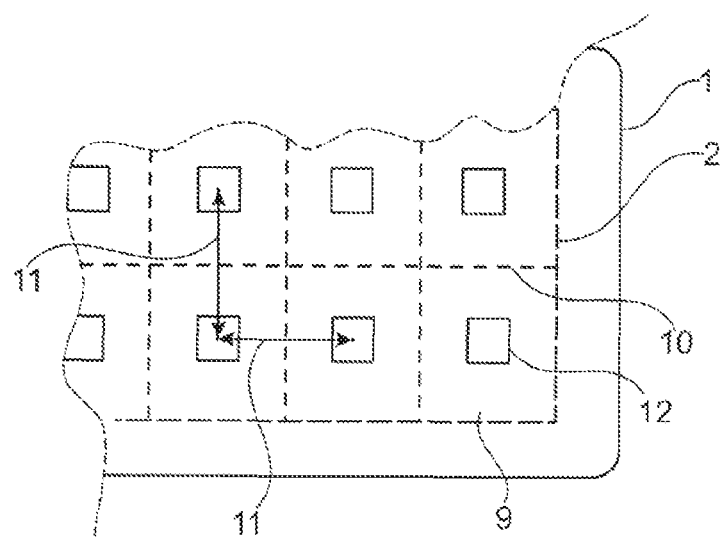

(51) Int. Cl.
*G02B 26/02* (2006.01)
*H01L 51/50* (2006.01)
*F21V 5/04* (2006.01)
*F21V 8/00* (2006.01)
*G02F 1/1335* (2006.01)
*H01L 51/52* (2006.01)

(52) U.S. Cl.
CPC ........ *G02F 1/133603* (2013.01); *H01L 51/50* (2013.01); *G02F 1/133512* (2013.01); *G02F 2001/133562* (2013.01); *H01L 51/5268* (2013.01)

(56) References Cited

U.S. PATENT DOCUMENTS

| | | | |
|---|---|---|---|
| 2007/0085471 A1 | 4/2007 | Cok | |
| 2007/0138951 A1* | 6/2007 | Park | H01L 27/144 313/504 |
| 2011/0193824 A1* | 8/2011 | Modarres | G06F 3/041 345/177 |

* cited by examiner

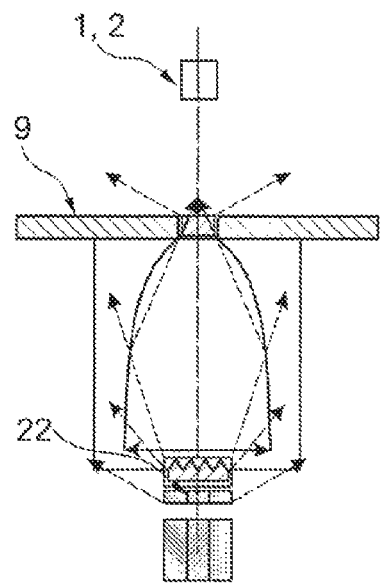
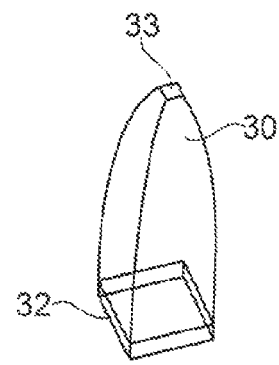
Fig. 5b
Fig. 5c
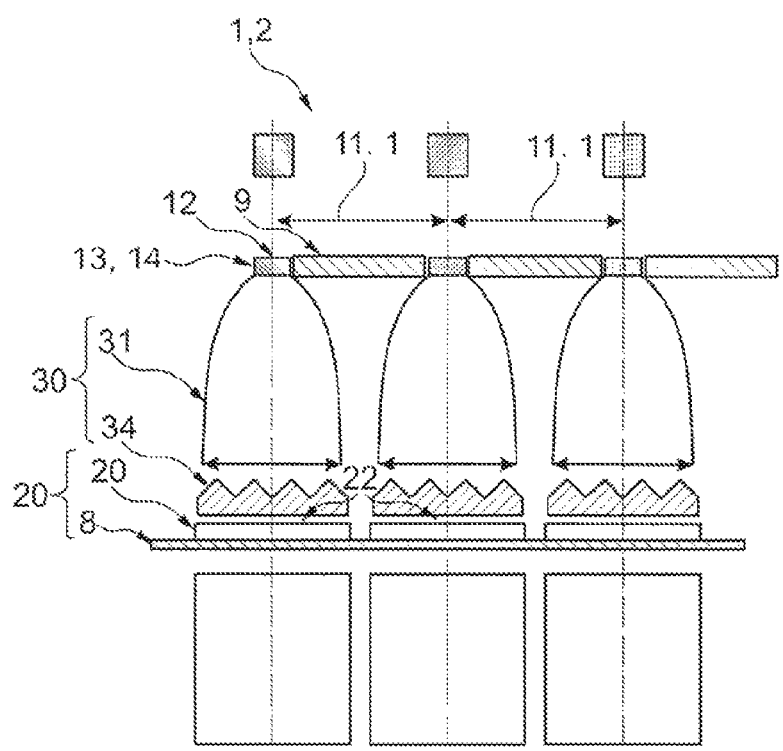
Fig. 5d

DISPLAY DEVICE

CROSS REFERENCE TO RELATED APPLICATION

This application claims benefit under 35 U.S.C. § 371 to international application No. PCT/EP2015/000355, filed on Feb. 18, 2015, which claims priority to German patent application numbers DE 102014002272.2, filed on Feb. 19, 2014; DE 102014009677.7, filed on Jun. 30, 2014; and DE 102014017764.5, filed on Dec. 3, 2014, the contents of which are incorporated by reference herein in their entireties.

The invention relates to a display device having a display area with a plurality of pixels. Such display devices are known in the state of the art, e.g. as LCD display devices or OLED display devices. A disadvantage of such display devices is the limited contrast range which these display devices have.

US 2008/0024470 discloses an invisible, light-transmissive display system in a light resistant material. Substantially invisible, tapered, light-transmissive holes are penetrated in a light-transmissive pattern through at least a portion of the light resistant material, using a laser beam having a focal width less than the smallest diameter of the tapered holes. The main objective consists in an application as LED indicators, e.g. for batteries or standby light signals which are intended to be integrated invisibly into a material, wherein the holes are intended to be very small per se, and the distance between the holes is adapted to the resolving power of the viewer.

The object of the present invention is to improve display devices of the type named at the outset, i.e. a display device having a display area with a plurality of pixels, e.g. LCD or OLED display devices, in particular to improve the display quality and/or the visual impression of such a display and/or to design the display device to be more energy-efficient and/or to expand the display device for further applications.

The object is achieved by the independent claim. Advantageous developments are defined in the dependent claims.

In particular, the object is achieved by a display device having a display area consisting of non-illuminated areas and illuminated areas, wherein the centroids of adjacent illuminated areas are located at distances from each other which are smaller than the resolving power of a viewer and wherein preferably the proportion of non-illuminated areas in the entire display area is more than 70%.

A display device is hereby firstly provided which, in a known manner, is at such a high resolution that the human viewer cannot distinguish the individual illuminated areas from one another. Additionally, however, a particular advantage is obtained by a deliberate reduction of the proportion of illuminated areas on the display area, which is precisely the opposite of general attempts to maximize the illuminated area, and an enlargement of the non-illuminated areas between the illuminated areas. Dark areas will then hereby actually also be able to remain dark, as they are proportionally much larger than the illuminated areas, even more so e.g. when the proportion of non-illuminated areas is e.g. more than 95% (a preferred feature of this invention, see below), and are less light-reflective, which is particularly advantageous in darker areas of the image and/or in strong ambient light. This in turn provides a good electricity-saving potential, as less light is needed to achieve a good contrast value (with available ambient light). Furthermore, an additional increase in contrast is achieved because there is a greater separation between the individual illuminated areas due to non-illuminated areas, and thus on the one hand there is no, or only a substantially reduced, light "crosstalk" between adjacent illuminated areas.

By a display device or a display is meant a device which is set up to display preferably digital or digitized images, text, graphics or video, which are each composed of individual pixels. For example, it is a display of a hand-held device (e.g. mobile radio unit/smartphone, wristwatch/pocket watch, pocket media player, tablet etc.), of a conventional computer (laptop, desktop etc.), of a television or of an advertising/information display panel (e.g. in underground railways, sports stadia or department stores, on walls of houses etc.).

The display area is preferably an area of the display device facing the viewer, within which the individual pixels are arranged. The display area is preferably limited by an (imaginary) line which runs along the outermost pixel, preferably along the outermost illuminated areas of the display device. Preferably, as a rule, a frame which e.g. ensures mechanical stability, but which is all the more advantageous for e.g. the design the thinner it is, runs around the display area.

By illuminated area is meant an area from which light beams emanate towards the viewer when in switched-on mode. The light beams can be either generated or emitted directly in the area (e.g. by an active light source, such as an LED, arranged in the illuminated area) or they can be guided to the viewer through the illuminated area (background lighting as with LCD screens). The area preferably extends partially or completely through air or an immaterial area. It is preferably surrounded by a frame or a mask. Shown simply, an illuminated area can thus be a hole or a bore which provides light or light beams with an opening out of which the light beams reach the viewer. Particularly preferably, the area consists, partially or completely, of a solid that is at least partially, or to a certain degree, or completely transparent, or the area runs through same, partially or completely. For example, the illuminated areas are those areas of the display device which represent the subpixels and emit the light to the viewer when the subpixels are illuminated. The illuminated area can have any shape, but is preferably square or round. Preferably, at least one illuminated area shape is identically present with uniform repetition. One illuminated area is preferably assigned to one pixel. Furthermore, it is advantageous if a pixel or a subpixel, for example an RGB subpixel, has a plurality of illuminated areas. In this way, the light intensity and the colour representation can be achieved more finely graduated. Furthermore, it is preferred that a pixel has at least two illuminated areas, with the result that a light emission can be achieved in a plurality of spatial directions, preferably in opposite directions. In this way, e.g. a display area of a display device can provide a plurality of display areas to the viewer, with the result that for example a tablet computer has a display on each side or on the top and bottom, in order to simplify handling yet further. Self-evidently, other surfaces also facing the viewer can transmit light to same. Also in this context, by an illuminated area is meant a surface from which light beams emanate towards the viewer in a switched-on mode.

By non-illuminated areas are meant areas which are present between the illuminated areas and which do not themselves illuminate and are not backlit. Preferably one or all non-illuminated areas is/are at least 90% light resistant.

The centroid of an illuminated area is the geometric focus or focus of the area which corresponds, mathematically, to the averaging of all points within the area.

Distances which are smaller than the resolving power of a viewer are preferably such that the pixels or illuminated areas are arranged so close together that a viewer whose eyes are preferably at a distance from the display device which is customary for the specific type of display device in the use of the display device can no longer distinguish between two adjacent pixels or illuminated areas.

Preferably, the distances which are smaller than the resolving power of the viewer are those distances which appear, to the viewer, to be at an angle of at most two angular minutes. The pixels or illuminated areas are hereby no longer distinguishable to a majority of viewers, as human resolving power, under the most unfavourable conditions, corresponds to approximately 2 angular minutes. Particularly preferably, distances to the viewer appear to be at most at an angle of 1 angular minute, particularly preferably 0.5 angular minutes, particularly preferably 0.25 angular minutes. The pixels or illuminated areas are hereby no longer distinguishable to almost all human viewers. The smaller the maximum angle, the fewer viewers there are with sufficiently good visual capacity to distinguish between two pixels or illuminated areas.

Preferably, the eye(s) of the viewer is (are) at a distance from the display area which is customary for the specific type of display device in the use of the display device. For example, the distance is 5 cm to 1.20 m, preferably 15 cm to 60 cm for displays of hand-held devices (mobile telephone, watch, tablet computer), 25 cm to 2 m, preferably 40 cm to 1 m for displays of desktop computers, 1 m to 7 m, preferably 2 m to 5 m for televisions, and/or 2 m to 100 m, preferably 5 m to more than 100 m for advertising/information display panels. Particularly preferably, the distances which are smaller than the resolving power of the viewer are less than 1 mm, wherein this is e.g. a distance in the case of a television at which the user can then no longer distinguish between the individual pixels or illuminated areas at a customary viewing distance (>2 m).

For example, the display device is a desktop computer with a minimum user distance (relative to the eye) of 50 cm. On the hypothetical assumption that e.g. 70% of potential users do not have resolving power better than 0.6 angular minutes, the pixels or illuminated areas of the display device are at a distance from one another of less than or equal to 87 μm, preferably 80 μm, for a safety margin, thus making a particularly high-quality representation possible for at least 70% of users during customary use of the display device, because they cannot distinguish between individual illuminated areas. The result is a resolution of the display device of 317 DPI, preferably 320 DPI with a safety margin.

Preferably, the distances which are smaller than the resolving power of the viewer are at most 190 μm, preferably at most 80 μm, particularly preferably at most 50 μm. It is hereby achieved that even if the viewer moves closer to the display area than is customary, he cannot distinguish between individual pixels or illuminated areas. Depending on the resolving power and accommodation ability of the individual viewer, it thus does not even matter how close the individual viewer comes to the display device because he cannot distinguish between the individual pixels or illuminated areas even with optimum use of his eyesight and approaching the closest focussing distance of his eyes.

Preferably, the extent of one, preferably every, illuminated area is at most 70 μm, preferably at most 25 μm, particularly preferably at most 10 μm or even at most 5 μm. It is hereby achieved that with the naked eye the viewer cannot recognize illuminated areas (when switched off) and the contrast has a greater effect. The extent is preferably an extent, preferably the maximum extent, of an illuminated area parallel to the display area. Particularly preferably the extent is smaller than or equal to the wavelength of the light which is visible and/or which is to be passed through. It is e.g. at most 2 μm, preferably at most 1 μm or at most 0.5 μm. The exit angle of the light emanating from the illuminated area is hereby greater, in particular because of the Rayleigh criterion.

The proportion of non-illuminated areas in the entire display area is preferably the proportion of the sum of all portions of the area of non-illuminated areas on the surface area of the entire display area. It is preferably inverse to the proportion of illuminated areas at the display area, i.e. the proportion of non-illuminated areas and the proportion of illuminated areas in the entire display area is preferably 100%.

The proportion of illuminated areas in the display area is preferably the proportion of the sum of all portions of the area of illuminated areas in the entire display area.

Thus far, the non-illuminated areas of the display area have customarily resulted because of wirings of the control of LCD cells and, in the state of the art, the aim has been to minimize these other areas as much as possible so that the illuminated areas receive as much space as possible. Therefore, in a preferred display device, it is advantageous if at least one functional element is arranged in the space between the illuminated areas in order to make use of the space between the illuminated areas. Thus, further functions can be integrated with the help of the at least one functional element. Thus, the at least one functional element can for example have a solar element and/or a sensor. Such a sensor can, for example, be a temperature sensor, a distance sensor, a pressure sensor, a gas sensor or an image sensor.

The proportion of non-illuminated areas in the entire display area is preferably greater than 80%, preferably greater than 90%, particularly preferably greater than 95%, quite particularly preferably greater than 98% and finally even more preferably at least 99%.

Preferably, in analogy to this, the proportion of illuminated areas in the entire display area is at most 20%, preferably at most 10%, particularly preferably at most 5%, quite particularly preferably at most 2% and finally even more preferably at most 1%.

The higher the proportion of non-illuminated areas and/or the lower the proportion of illuminated areas, the stronger the effects according to the invention as mentioned at the outset.

In a further display device according to the invention, this has at least one functional element. The display device can be extended by further functions with the help of the at least one functional element. Thus, the at least one functional element can for example have a solar element for converting solar energy into electrical energy. This enables the display device to be supplied with energy. Thus, a part or all of the energy required for the display device can be obtained from solar energy, whereby e.g. a battery of the display device can be discharged or even dispensed with.

It is also possible that the at least one functional element has a sensor, preferably a two-dimensional and/or three-dimensional sensor. It is further preferred if the at least one functional element has an image sensor or a touch-sensitive sensor, in particular a piezo element. A sensor can expand the display device by a further application, e.g. by detecting user input. User inputs can for example be detected with the help of a temperature sensor, a distance sensor, a pressure sensor, a gas sensor or an image sensor.

It is advantageous if the temperature sensor has a temperature probe with an oscillating crystal, or a thermocouple which converts a temperature difference into an electrical voltage by the Seebeck effect. It is also possible that the temperature sensor has a pyroelectric material which changes the charge carrier density on the surface upon temperature fluctuations, by changing the spontaneous polarization, or a mechanical temperature switch, e.g. a bimetallic switch, which actuates a switch by means of a deformation of a bimetal.

Furthermore, it is advantageous if the distance sensor operates according to the functional principle of variable capacity. A capacitive sensor has two plate elements insulated from one another which form a capacitor, wherein e.g. the finger of a user represents a dielectric. The dielectric in the capacitor varies its capacity, which can be detected easily by measuring voltage. Thus, a distance sensor is a touch-sensitive sensor.

It is also favourable if the pressure sensor is designed to be piezo-resistive or piezo-electric. In a piezo-resistive pressure sensor, the pressure to be measured deforms a membrane which has applied electrical resistances. The pressure-dependent deformation of the membrane also deforms resistances diffused into the membrane, leading to the formation of an electric current which can also be measured simply. In a piezo-electric pressure sensor the pressure to be measured causes a separation of charge in a crystal, whereby an electrical current is produced. The pressure displaces charges inside the crystal, whereby an electric charge forms on the surface, which charge is proportional to the force. If the sensor is intended to be used for measuring pressure, the pressure needs firstly to be converted into a force via a membrane. Consequently, a pressure sensor is a touch-sensitive sensor, wherein the piezo-resistive and the piezo-electric pressure sensor have a piezo element. It is also conceivable to produce a force using the pressure sensor and thus to guarantee haptic feedback in the form of vibration, by e.g. the piezo element of the pressure sensor being activated and deactivated in cycles.

Advantageously, the sensor of the at least one functional element is a gas sensor, which preferably operates according to a resistance principle in which the gas or mixture of gases to be measured directly influences the conductivity of a gas-sensitive sensor layer. This change in resistance serves as a measurement variable. Such sensors are e.g. inorganic metal-oxide semiconductors (MOX) or conductive polymers. A gas sensor can also operate according to the capacitive principle, in which the capacity of a capacitor is measured, which in turn is influenced by a gas-sensitive dielectric, such as for example in the case of a polymer sensor for measuring moisture.

Particularly preferably, the at least one functional element has a two-dimensional or three-dimensional sensor, in particular an image sensor. By a two-dimensional sensor or two-dimensional image sensor is meant a device for capturing two-dimensional images, for which semiconductor-based image sensors which can collect light are used. This is preferably a so-called CCD sensor or a so-called CMOS sensor. A three-dimensional sensor or three-dimensional image sensor has at least two two-dimensional sensors or image sensors separated from one another. In this way, a subject can be captured following the principle of stereoscopy in order to convey a three-dimensional impression when reproducing two two-dimensionally separated images.

In a further display device according to the invention, the at least one functional element has a beam-shaping element and a beam-detection device. Advantageously, the beam-shaping element, which is preferably transparent, steers light onto the beam-detection device. Using this embodiment, it is for example possible to achieve a plenoptic camera, also called a light-field camera, or a type of compound eye such as an insect might have. In this case it is advantageous if several functional elements form such a camera. Furthermore, it is favourable if the beam-shaping element is fitted into the surface of the display device. A smooth surface can thus be achieved. Preferably, the beam-shaping element is a lens of any shape and the beam-detection device is an image sensor.

Unlike a conventional camera, a plenoptic camera captures not only the position and intensity of a light beam striking an image sensor, but also the direction from which the light beam strikes it. In this way, a so-called light-field measurement can be undertaken which e.g. in a specific application can be achieved technically by a grid of several microlenses in front of an image sensor.

Advantages of a plenoptic camera are great depth of focus, no waiting time for focussing processes to be completed and subsequent adaptation of the focussing plane of a recorded image. As depth information can also be ascertained from the image data acquired, a plenoptic camera is also suitable as a three-dimensional camera, wherein a subsequent extension of the depth of focus is also possible using the recorded image data.

Furthermore, by means of the functional element which has a beam-shaping element and a beam-detection device it is possible to make a photocopy or an image e.g. of an object. A normal camera can thus likewise be achieved using a plurality of functional elements.

Furthermore, it is advantageous if an illuminated area and at least one functional element are simultaneously controlled in order to capture an object by means of reflection and absorption. Advantageously, the illuminated area and the at least one functional element border one another. Thus, simply and efficiently, the reflection and absorption of a body or object can be detected, as a result of which the surface of the object can be determined according to properties such as e.g. colour, brightness and contrast, as well as structure. Thus, an object can be captured or scanned or copied, with the result that a copy of same can be represented, in particular via the display device or the illuminated areas and non-illuminated areas thereof. It is favourable if the object is arranged near to, in particular directly next to, the display device. This is because, the closer the object, the better and more realistically the display device can capture this object using the illuminated areas and the at least one functional element.

With a camera in the style of a compound eye of an insect, the temporal resolution can be higher than a standard camera. This high temporal resolution is suitable in particular for moving objects, such as e.g. fingers. Thus, using a camera in the style of a compound eye, a three-dimensional sensor can be produced e.g. for entering user commands. For a specific implementation of an aforementioned compound eye, the at least one functional element described can be used, in particular in conjunction with further functional elements, wherein each functional element preferably has a beam-shaping element and a beam-detection device. Advantageously, unlike a real compound eye, the eye artificially reproduced by the display device is designed flat, preferably in the plane of the display device.

In summary, using the at least one functional element implemented as a sensor with a plurality of cameras, three-dimensional touch and proximity sensors can be produced.

Furthermore, it is favourable if the at least one functional element has an optoelectronic sensor. It is preferred if the at least one functional element has an optoelectronic sensor with a transmitter and a receiver. In this way, the shape of items or objects can be detected by the display device. By arranging several such optoelectronic sensors next to one another, a detection field can be implemented for objects which are positioned in front of the display device. Thus, fingers of a user can also be detected, whereby user inputs can be captured. Self-evidently—as already mentioned—surfaces and shapes of objects can also be captured.

In a further display device according to the invention, at least one non-illuminated area has at least one functional element. Thus the space between two illuminated areas can be used for the at least one functional element. Such an arrangement enables the additional integration e.g. of a temperature sensor, distance sensor, pressure sensor, gas sensor or image sensor in the display device, whereby the space available is used in the best possible way. Thus, small devices with a high sensor density and further properties can be created.

In a further display device according to the invention one or more illuminated areas are assigned to a pixel and the display area has a plurality of such pixels, which are arranged in a preferably uniform, repeating pattern, with the result that images can be composed from the pixels.

Preferably, illuminated areas of one pixel have shorter distances from one another than the distances to illuminated areas of another pixel. Preferably, one illuminated area, particularly preferably all illuminated areas are separated from other illuminated areas of other pixels, e.g. by an area which is not light-emitting or light-conducting, i.e. through non-illuminated areas. For example, the display device is monochromatic and each of the pixels is formed by a single illuminated area, or the display device is polychromatic and each of the pixels is formed by two or more illuminated areas, wherein the illuminated areas light up in different primary colours or the pixels are formed by an illuminated area each which lights up polychromatically.

In a further display device according to the invention, a majority, preferably all, of the non-illuminated areas have a reflectance of diffuse reflection of less than 50%.

The non-illuminated areas are hereby advantageously used to positively influence the contrast ratio. The less diffuse reflection occurs, the darker the non-illuminated areas appear. A decisive advantage is in turn that, unlike customary display devices, a much larger area is available (specifically the entire area of all non-illuminated areas) to produce a low reflectance, wherein it need not be taken into consideration that the non-illuminated areas have to be transparent or can transmit light, and a low reflectance can thus be achieved more simply and with greater flexibility (e.g. by means of the choice of material, surface structure, surface coating etc.). Preferably, the reflectance of diffuse reflection is less than 25%, particularly preferably less than 10%, quite particularly preferably less than 5% and even more preferably less than 1%.

By contrast, in the state of the art, the background of the illuminated areas (OLED, LCD, LED, etc.) is provided with a very high reflectance in order to bring forth as much light as possible (by means of an illuminated area that is as large as possible). This has a negative effect on the contrast in darker areas, in particular in strong ambient light, which in turn forces the light intensity to increase in order to achieve a good contrast with respect to the ambient light, which in turn requires more energy. This is in turn a substantial disadvantage for e.g. portable devices. With this invention, precisely the opposite is intended and achieved (even if the background of the minimum illuminated areas is provided with a very high reflectance).

A reflectance of diffuse reflection can be measured preferably as a so-called light reflectance value, LRV (preferably according to the British measurement standard BS8493: 2008+A1:2010), particularly preferably as an albedo value by means of an albedometer, wherein preferably a majority, preferably all of the non-illuminated areas have an albedo of less than 0.5, preferably less than 0.25, particularly preferably less than 0.10, quite particularly preferably less than 0.05 and even more preferably less than 0.01. Albedo is preferably the ratio of the radiation flux reaching the viewer from a full irradiated surface to that which would reach the viewer from an absolutely white disk (a so-called Lambertian radiator) of the same size reflecting diffusely, in the case of normal incidence of light.

In a further display device according to the invention, a majority, preferably all, of the non-illuminated areas have a reflectance of specular reflection of less than 50%.

The non-illuminated areas are hereby advantageously used to positively influence the contrast ratio. The less specular reflection occurs, the darker the non-illuminated areas appear, as brighter objects are less reflected thereupon. Additionally, legibility is increased as a blending in of non-uniform mirror images over the display image is reduced. A decisive advantage is in turn that, unlike customary display devices, a much larger area is available for producing a low reflectance. Preferably, the reflectance of specular reflection is less than 25%, particularly preferably less than 10%, quite particularly preferably less than 5% and even more preferably less than 1%. In the state of the art (conventional screens), the (larger) illuminated areas are mostly provided with glass or a glass-like material, and thus the entire display area has a larger specular reflectance. By contrast, this invention is based on very small illuminated areas, with the result that the display area therefore has scarcely any specular reflections, even if the illuminated areas are provided with glass or a glass-like material.

A reflectance of specular reflection can be measured preferably in GU (gloss unit) by means of a gloss meter, wherein preferably a majority, preferably all, of the non-illuminated areas have a gloss in GU of less than 50 GU, preferably less than 25 GU, particularly preferably less than 10 GU, quite particularly preferably less than 5 GU and even more preferably less than 1 GU. Preferably, the scale for GU is based on the reference value which is achieved in the case of a polished, black glass. During calibration, this reference value is preferably fixed at 100 GU. The second reference point of the scale is preferably 0 GU, the measurement value at which a perfectly matte surface is achieved.

In a further display device according to the invention, the entire display area has a reflectance of diffuse reflection of less than 50% and/or a reflectance of specular reflection of less than 50%.

Because the proportion of non-illuminated areas on the whole surface area is dominant, a reflectance (specular and/or diffuse) of the entire display area can also be effectively reduced in a simple manner, and thus a very good contrast ratio obtained. Preferably, the reflectance of specular reflection of the entire display area is less than 25%, particularly preferably less than 10%, quite particularly preferably less than 5% and even more preferably less than 1%. Preferably, the reflectance of diffuse reflection of the entire display area is less than 25%, particularly preferably less than 10%, quite particularly preferably less than 5% and even more preferably less than 1%.

In a further display device according to the invention, a majority, preferably all, of the non-illuminated areas, have a dark colour or are black.

A lower reflectance in particular of the diffuse reflection is hereby achieved.

A dark colour is preferably a colour in an RGB colour space (e.g. sRGB or Adobe RGB 1998), the mean value of the R, G and B values of which is less than or equal to 25% of the maximum value, i.e. e.g. at a maximum value of 255 (for each of the R, G, B 256 steps), the mean value is lower than 63.75.

Particularly preferably, a dark colour is one of the Pantone colours: 1545, 1545 C, 161, 161 C, 168, 1815, 1817, 2617 C, 262, 2627, 2627 C, 2685 C, 2695 C, 273 C, 2735 C, 2738, 2738 C, 274, 274 C, 2745, 2745 C, 2747, 2747 C, 2748, 2748 C, 275, 275 C, 2755, 2755 C, 2756 C, 2757, 2757 C, 2758, 2758 C, 276, 276 C, 2765, 2765 C, 2766, 2766 C, 2767, 2767 C, 2768, 2768 C, 280, 280 C, 281, 281 C, 282, 282 C, 287 C, 288, 288 C, 289, 289 C, 294 C, 295, 295 C, 2955, 2955 C, 296, 296 C, 2965, 2965 C, 302, 302 C, 3025, 303, 303 C, 3035, 3035 C, 309, 309 C, 316, 316 C, 3165, 3165 C, 3292, 3292 C, 3298 C, 330, 330 C, 3302, 3302 C, 3305, 3305 C, 3308, 3308 C, 336, 336 C, 342, 342 C, 3425, 3425 C, 343, 343 C, 3435, 3435 C, 349, 349 C, 350, 350 C, 356, 356 C, 357, 357 C, 368 2X, 412, 412 C, 419, 419 C, 426, 426 C, 432 C, 433, 433 2X, 433 C, 439, 439 C, 440, 440 C, 447, 447 C, 448 C, 4485, 4625, 4625 C, 469, 4695, 4695 C, 476 C, 483, 483 C, 490, 490 C, 497, 497 C, 4975, 4975 C, 504, 504 C, 505, 5115, 5115 C, 5185, 5185 C, 5255, 5255 C, 532, 532 C, 533 C, 534 C, 539, 539 C, 5395, 5395 C, 540, 540 C, 541, 541 C, 546, 546 C, 5463, 5463 C, 5467, 5467 C, 547, 547 C, 548, 548 C, 553, 553 C, 5535, 5535 C, 554, 554 C, 560, 560 C, 5605, 5605 C, 561 C, 567 C, 5743 C, 5747 C, 5753, 5757, 5815, 626, 627, 627 C, 648, 648 C, 654, 654 C, 655, 655 C, 662, 662 C, 669 C, 725, 731, 732, 732 C, 7421 C, 7449 C, 7463 C, 7476 C, 7483 C, 7484 C, 7533 C, 7546 C, 7547 C, 7554 C, 7631 C, 7645 C, 7693 C, 7694 C, 7720 C, 7721 C, 7722 C, 7727 C, 7728 C, 7729 C, 7732 C, 7733 C, Black, Black 2, Black 2 2X, Black 2 C, Black 3, Black 3 2X, Black 3 C, Black 4, Black 4 2X, Black 4 C, Black 5, Black 5 2X, Black 5 C, Black 6, Black 6 2X, Black 6 C, Black 7, Black 7 2X, Black 7 C, Black C, Blue 072 C, Dark Blue C, Neutral Black C, Reflex Blue, Reflex Blue 2X, Reflex Blue C.

In a further display device according to the invention, a majority, preferably all, of the non-illuminated areas have a mean roughness index in the range from 0.2 µm to 1.0 µm.

Because of this, in particular specular reflections in the range of the wavelengths of visible light are reduced. Preferably, the mean roughness index is in the range from 0.4 µm-0.8 µm. Preferably, to establish this measurement value, the surface is scanned over a specific measured section and all height and depth differences of the rough surface are recorded. After calculating the definite integral of the course of this roughness over the measured section, this result is finally divided by the length of the measured section.

In a further display device according to the invention, a majority, preferably all, of the non-illuminated areas are coated by means of an anti-reflection coating.

In particular specular reflections are also hereby reduced. An anti-reflection coating is preferably an anti-reflective film (e.g. 3M™ Vikuiti™) or an antireflective coating. The anti-reflection coating preferably has a rough surface (e.g. with a mean roughness index in the range from 0.2 µm to 1.0 µm) and/or antireflective coatings based on destructive interference.

In a further display device according to the invention, the display device has an electronic compensation device, by means of which a minimum brightness of the illuminated areas can be set automatically for adapting the representation of black image pixels in dependence on the ambient brightness.

The contrast ratio can hereby be adapted to the ambient brightness. Even if the non-illuminated areas are designed to be as dark and non-reflective as possible, the brightness of the non-illuminated areas will be lighter or darker, depending on the ambient brightness. By means of the compensation device, the minimum brightness of the illuminated areas can, however, also be correspondingly adapted to the brightness of the non-illuminated areas. A black image pixel is one which e.g. contains (0, 0, 0) as RGB image information. By means of the compensation device, this black point is adapted to the ambient brightness, i.e. e.g. it is increased in the case of greater ambient brightness and reduced in the case of lower ambient brightness. For example, in the case of high solar radiation, a black pixel is not represented by completely switched-off illuminated areas; instead, the illuminated areas are activated with a brightness, with the result that the illuminated areas have approximately the same brightness as the non-illuminated areas. The other brightness levels of the image to be displayed are then distributed over the remaining area between the minimum brightness set by the compensation device and the maximum brightness of the illuminated areas. In this way, the dark picture proportion is not "reduced". Preferably, the electronic compensation device has an ambient light sensor.

In the description below, inter alia, light sources are also named. These, and their relation to the illuminated areas, are first described in general terms.

A light source is preferably a controllable light source, wherein the light emitted by the light source can be at least switched on and off, but preferably the intensity of the emitted light can be modulated in a plurality of steps or continuously. It is e.g. an active light source such as an LED (OLED, micro LED), a laser (e.g. a VCSEL or surface emitter), preferably with a beam diameter of 5 µm or less, or a plasma cell. Very small and energy-efficient light sources are thus possible. A light source can also be a UV LED or blue LED which interacts with a layer of luminescent material, or an electron emitter which interacts with a luminescent material. The maximum extent of a light-active area (i.e. active illuminated area) of the light source (e.g. the area of the PN junction) or of a laser beam generated by the light source parallel to the display area is preferably smaller than or equal to the maximum extent of the illuminated area, i.e. e.g. at most 70 µm, preferably at most 25 µm, particularly preferably at most 10 µm or 5 µm or even smaller e.g. 2 µm, 1 µm or 0.5 µm. Preferably, the illuminated area has a scatter element, in particular if the maximum extent of the beam, in particular laser beam, generated by the light source is smaller than the maximum extent of the illuminated area. Preferably, the light sources are elements of a light source array or pixels or subpixels of a display, in particular an OLED display, incorporated in the display device as an illumination device and arranged behind the illumination areas. For example, a pixel and/or subpixel array of a display, e.g. 1×2, 2×2, 4×4, 5×5, 10×10 or 100×100 pixels or subpixels is assigned to an illuminated area.

Preferably, a light source, in particular developed as UV LED or blue LED, has a layer with quantum dots or phosphor in order to generate an RGB colour space (e.g. sRGB or Adobe RGB 1998) or a higher sampled colour range or colour space. A quantum dot is a nanoscopic material structure which generally has semiconductor material (e.g. InGaAs, CdSe or even GaInP/InP), in which the mobility of charge carriers is confined in all spatial directions, even within a quantum dot. In this way, its energy can no longer assume continuous, but only discrete values. It is thus possible to adapt electronic and optical properties of quantum dots precisely to desired formulations of the problem.

Advantageously, a pixel has three quantum dots with which desired optical properties can be set, in a targeted manner, in the three spatial directions. Advantageously, the layer can be imprinted with quantum dots or phosphor in a printing process, in particular in a three-dimensional printing process, and also serve as diffusion layer or light-scattering layer.

Furthermore, by means of the layer with quantum dots it is possible to emit light through an illuminated area in one direction, in a targeted manner, and receive light from another direction. An illuminated area and a functional element in one can thus be produced.

Preferably, at least one of the light sources, preferably every light source, is a dichromatic, preferably polychromatic light source or there are different light sources with different emission wavelengths. A two-colour, multicolour or full-colour representation by means of the display device is hereby possible. Monochromatic means preferably that the light source emits substantially in a specific, preferably constant, wavelength range or wavelength mix (e.g. red), dichromatic means preferably that the light source is set up to emit light controllably in two different wavelength ranges (e.g. a respectively controllable green and red proportion), polychromatic means preferably that the light source is set up to emit light controllably in two or more different wavelength ranges (e.g. a respectively controllable green and red and blue proportion).

Preferably, precisely one monochromatic light source, preferably polychromatic light source, is assigned to each illuminated area. The light sources are hereby assigned to the illuminated areas, whereby an individual modulation of the light sources is possible and thus this embodiment is different, e.g. from an LCD which has poorer energy consumption, in which light is generated over a large area but then needs to be darkened again locally. Instead of this spatially subtractive image formation, a spatially additive image formation is preferably made possible. Different monochromatic light sources are e.g. those which each radiate in one wavelength range per se, but the wavelength ranges of the individual light sources differ from each other (e.g. red, green, blue). Identical monochromatic light sources are e.g. those which all radiate in substantially the same wavelength range in each case. Alternatively, a plurality of illuminated areas are assigned to one or more monochromatic light sources, preferably polychromatic light sources. Preferably, a pixel is formed by a plurality of illuminated areas, to which light sources of different wavelengths are assigned. For example, a pixel is formed by three or more illuminated areas, wherein at least one illuminated area is assigned one or more light sources which emit green light to the illuminated area, at least one second illuminated area is assigned one or more light sources which emit blue light to the second illuminated area, and at least one third illuminated area is assigned one or more light sources which emit red light to the third illuminated area. Preferably a light path exists to each of the illuminated areas, for a plurality of monochromatic light sources. Alternatively, a light path exists to each of the illuminated areas, for one or more polychromatic light sources. Preferably, a non-imaging optical element, e.g. a scatter element, is present for an advantageous homogenization of the polychromatic light sources.

In a further display device according to the invention, the display device has an illumination device with a substrate on which at least one light source or a plurality of light sources is/are arranged. A display device having a display area according to the invention can hereby be produced in a simple manner.

Furthermore, it is preferred that at least one light source and at least one functional element are arranged on the substrate. This enables a simple assembly and thus a cost-effective production as both the light source and also the at least one functional element share steps during production. Also, an arrangement of different components on a substrate or on a ground plane makes it easier to check for manufacturing errors. Assembly is particularly simple if the at least one light source and the at least one functional element are arranged directly on the substrate. A production of light source, functional element and substrate in one workflow is thus at least partly possible. Production time and costs can thus be saved.

From the viewer's point of view, the illumination device is preferably arranged behind the illuminated areas, and set up to illuminate the illuminated areas from behind, i.e. from the rear thereof. The rear is the side of an illuminated area facing away from the viewer. It is preferred if the illuminated areas are understood to be an area from which light beams emanate towards the viewer in switched-on mode. As already mentioned, the surface extends preferably partially or fully through air or an immaterial area. It is preferably framed by a frame or a mask. Shown simply, an illuminated area can thus be a hole or a bore, which provide light or light beams with an opening through which the light beams reach the viewer.

The illumination device preferably has one or more active light sources or passive light sources, such as e.g. deflecting mirrors, which can guide light from another light source, which for example can also represent ambient light, in particular daylight or sunlight, onto the illuminated areas, from behind.

The distance between the illuminated areas and the illumination device (e.g. measured from a light-emitting or light-reflecting surface of the illumination device, which emits or transmits light already substantially parallel to the viewing direction) is preferably at most 3 mm, particularly preferably at most 1 mm, quite particularly preferably at most 0.5 mm or even more preferably at most 0.2 mm.

The substrate is preferably a flat plate, e.g. a circuit board or a wafer.

One possible realization of light sources provides, for example, lasers with e.g. 5 µm beam diameter, which are arranged on a substrate (such as for example a Si wafer) as an array, e.g. in the form of a square with an edge length of e.g. 50 µm. Preferably, a scatter element is arranged over such a square, which also simultaneously forms the illuminated area. The individual lasers in a square preferably have different emission wavelengths from each other. Many such units then form pixels or subpixels of the display device.

In a further display device according to the invention, at least one functional element is arranged between two illuminated areas and/or between two light sources. In this way, the unused space between the light sources or the illuminated areas can be used for further functions, such as e.g. sensors in the specific embodiment of the at least one functional element.

It is also possible that at least one functional element is arranged between a non-illuminated area and a light source.

Also, in an embodiment of the display device with a minimum distance between a non-illuminated area and a light source or an illuminated area, the resulting space can be used in order to integrate further functionalities by e.g. a solar element for obtaining energy or a sensor, in particular a touch sensor. A space-saving design can thus be achieved.

In a further display device according to the invention, each of the illuminated areas is formed by one of the light sources or by an optical scatter element or transparent cover element or optical colour-filter element which can be illuminated by one of the light sources and the non-illuminated areas of the display area are formed by areas of the substrate and/or by areas of a filling material between the illuminated areas.

A particularly efficient image representation is made possible by this preferred design of the illuminated areas and assignment to the light sources. In particular the reflective properties of the non-illuminated areas can be set very well due to the design of the non-illuminated areas of substrate material or filling material. The filling material is preferably a pourable material or is built up by means of a 3D printing process between the light sources or a material which can be adapted to the shape (around the illuminated areas) or a material which allows the illuminated areas to shine through (transparent and/or close-meshed and/or perforated).

An optical scatter element is preferably a body which guides light which strikes the scatter element from one direction in more than two different directions, preferably in a plurality of different directions, whether transmissively and/or reflectively. For example, the optical scatter element is a semi-transparent and/or matte body (translucent glass body) made of glass or plastic, preferably with embedded scatter particles (e.g. silver particles or nanoparticles), a microprism, a matte film for adhesion, a tiny ground glass or a diffractive optical system, e.g. a grid. The scatter element is preferably set up to serve (approximately) as a Lambertian radiator, e.g. with the result that a uniform radiation within a large solid angle, e.g. 180°, is produced. Preferably, it is set up to scatter according to the Rayleigh effect and/or according to the Plasmonic effect. For example, this means that the scatter element has openings which are smaller than the wavelength of the visible light and/or the light to be passed through (e.g. 1 µm or less). It is preferred, e.g. in this case that the illuminated area is framed by a non-transparent mask (e.g. a cover layer described below) or a frame, and the extent of the illuminated area is e.g. less than the wavelength of the visible light and/or the light to be passed through, with the result that a scatter element is produced merely by the size of the illuminated area in combination with a framing.

In a further display device according to the invention each of the illuminated areas is formed by a hole or a bore or one of the light sources or by a shaped body, wherein preferably the non-illuminated areas of the display area are formed by areas of the substrate and/or by areas of a filling material between the illuminated areas.

As already explained at the outset, by an illuminated area is meant an area from which light beams emanate towards the viewer, in switched-on mode. The light beams can be either generated or emitted directly in the area (e.g. by an active light source arranged in the illuminated area such as a LED) or they can be guided to the viewer through the illuminated area (background illumination as with LCD screens). The area extends preferably partially or entirely through air or an immaterial area. It is preferably framed by a frame or a mask. Shown simply, an illuminated area can thus be a hole or a bore which gives light or light beams an opening from which the light beams reach the viewer.

It is particularly preferable that the shaped body or the illuminated area, in particular designed as a hole or a bore, forms a parallax barrier which is preferably designed as an aperture grille or lens which conveys an optical imaging by deflecting or refracting the light passing through, e.g. of a pixel. In other words, it is advantageous if the illuminated areas have a shaped body, in particular a parallax barrier, designed as an aperture grille or lens in order to convey an optical imaging by deflecting or refracting the light passing through.

Furthermore, in the embodiment of the illuminated areas as a hole or bore it is preferred to position light sources, formed as pixels, at a distance from the illuminated areas. The distance is preferably between 200 and 300 µm, particularly preferably 200, 250 or 300 µm. A slim or thin and weight-saving design can thus be achieved. Furthermore, it is favourable if a pixel has for example 9 illuminated areas which are preferably arranged in a square on the substrate, on which the light sources are advantageously applied.

It is favourable if each of the 9 illuminating areas of the pixel has 3 subpixels. In this way, a pixel can produce colours of an RGB colour space using 27 subpixels. For the pixels, preferably LEDs or OLEDs are used which preferably measure 9 µm×9 µm, wherein self-evidently other measurements are also possible. A smaller or larger number of subpixels is also conceivable, as well as a smaller or larger number of illuminated regions than those already presented.

Advantageously every pixel is assigned an illuminated area, wherein the illuminated area is designed in particular as a hole or a bore, and wherein the distance between the display area with its illuminated areas and the pixels belonging to every illuminated area is preferably between 200 and 300 µm, particularly preferably 200, 250 or 300 µm.

In this way, a parallax barrier can be produced with the illuminated areas, wherein preferably the illuminated area is designed as a hole or a bore, which preferably has a diameter of 5 to 15 µm, particularly preferably a diameter of 10 µm. Thus, depending on the angle at which the display device is oriented with its display area relative to a viewer, preferably light from only one of the 9 illuminated regions of the pixel can reach the viewer through the illuminated area or the hole. Because of the aforementioned measurements, it is possible to generate different images for each eye of a viewer, as a result of which a three-dimensional effect is created. Logically, by moving the display device or by orienting the display area of the display device relative to the viewer, differently illuminating areas of the pixel reach the viewer, with the result that a three-dimensional image can be achieved by means of the display device over a large angle range.

In a specific embodiment, at 80 µm×80 µm per pixel, preferably in the range between 50 µm and 80 µm per pixel, and for example a distance of 10 µm between the pixels, a high resolution can be produced for a three-dimensional view to be generated. In this way, a viewer of the display device thus obtains a high-resolution three-dimensional impression of an object represented on the display device, in both the horizontal and also the vertical direction. Furthermore, this high resolution of the generated three-dimensional view is available over a large angle range, wherein the term angle range is understood to mean the relative spatial orientation of the display device or the display area thereof to the viewer or to the viewing direction of same. Through this preferred embodiment of the illuminated areas and assignment to the light sources, a particular three-dimensional image representation, comparable to an autostereoscopic image representation, is possible, wherein in particular the reflective properties of the non-illuminated areas can be set very well by the design of the non-illuminated areas of substrate material or filling material.

Furthermore, it is advantageous if a plurality of holes or bores or shaped bodies form aperture grilles or a lens grid on a plurality of illuminated areas. Thus it is possible, in a simple manner, to produce a 3D display similar to an autostereoscopic 3D display. By a autostereoscopic 3D display is meant the display of autostereoscopic images on a display device.

In an autostereoscopic display device, two images are represented simultaneously for a three-dimensional impression. Using a plurality of parallax barriers, for example produced as diagonal aperture grilles or lens grids, the light of individual pixels is deflected in different directions in front of the display device and a different image is produced for each eye of a viewer.

Preferably, the shaped body has an input and an output. Preferably, the output has a larger area than the input. Preferably, the output faces the illuminated area and the display area, and the input faces the illumination device.

In a further display device according to the invention, the filling material has at least one functional element. There can thus be a saving on filling material and, simultaneously, functionality in a narrow space can be increased. This embodiment thus enables a particularly efficient use of the space available, wherein filling material can also be completely replaced, e.g. by a sensor or a solar element. A valuable space, filled with filling material, thus becomes usable for further functions.

In a further display device according to the invention, each light source has an electron emitter which is set up to cause a layer of luminescent material to actively light up by emitting an electron beam, or each light source has a UV emitter which is set up to cause a layer of luminescent material to actively light up by emitting a UV light beam.

In this way, light sources which are very efficient and spectrally well adjustable are produced. In particular, due to the area ratios of non-illuminated areas and illuminated areas according to the invention, the UV emitters and in particular the electron emitters can be better separated from each other, which is particularly advantageous in the case of electron emitters, which each require their own vacuum cell. By a UV emitter is also preferably meant an emitter which emits in the blue to violet range (with or without the UV range). A vacuum is necessary in the case of electron emitters and the distance between the illuminated areas of this invention can thus be used to incorporate spacers, which is very difficult in the state of the art, because the illuminated areas are very large or as large as possible and spacers cause interference (e.g. shadowing).

In a further display device according to the invention, the display device has an illumination device with a light source or with a plurality of light sources and the active illuminated area of the light source or, if the illumination device has a plurality of light sources, each of the active illuminated areas of the light sources has a surface area which is greater than the surface areas of the illuminated areas of the display area.

The light can hereby be produced on a greater area than the size of the illuminated areas and thus a higher radiation density can be achieved within the illuminated areas, preferably with additional concentration of the light on the smaller illuminated areas. Preferably, the surface of the illumination device or the sum of the surfaces of the illumination device which emit light is greater than the sum of all the surface areas of the illuminated areas. Preferably, the total extent of all the light sources assigned to an illuminated area is greater than the extent of the illuminated area. Preferably, the light sources are polychromatic and the light sources or the active illuminated areas thereof have an extent which is greater than 50%, preferably greater than 75% of the distance between the centroids of the illuminated areas. Preferably, the light sources are monochromatic and the light sources or the active illuminated areas thereof have an extent which is greater than 50%, preferably greater than 75% of one third of the distance between the centroids of the illuminated areas. The active illuminated area of the light source is the surface which actively lights up (e.g. the surface of a PN junction).

In a further display device according to the invention, each of the illuminated areas is formed by an optical scatter element or transparent cover element or optical colour-filter element which can be illuminated by the illumination device, and the non-illuminated areas of the display area are formed by areas of a filling material or substrate arranged between the illuminated areas.

A particularly efficient image representation is in turn possible due to this preferred design of the illuminated areas and assignment to the illumination device. In particular, the reflective properties of the non-illuminated areas can be set very well due to the design of the non-illuminated areas of substrate material or filling material. The scatter element is preferably a scatter element as described above in more detail.

In a further display device according to the invention, the display device has optical beam-shaping devices which are arranged between the illumination device and the display area, and preferably at least one, or precisely one, illuminated area is assigned to each beam-shaping device and each of the beam-shaping devices is set up to concentrate light from the illumination device onto the respective illuminated area.

Light can hereby be concentrated onto the illuminated areas by means of beam shaping, whereby the maximum achievable brightness is increased. The optical beam-shaping elements are preferably set up to concentrate and/or focus light from the illumination device onto an illuminated area. Preferably, one or more beam-shaping devices has a tip or a tubular or cylindrical end-piece (a so-called "light guide"), e.g. a fibre-glass piece, particularly preferably with a sealing diffusion layer, at the output.

A beam-shaping element is preferably assigned to an illuminated area if light propagates from the beam-shaping element coming through the illuminated area. The extent of the beam-shaping elements along the optical axis is preferably less than 3 mm, particularly preferably less than 1 mm, quite particularly preferably less than 0.5 mm or even more preferably less than 0.25 mm. The beam-shaping elements are preferably cast or produced by means of laser lithography. Preferably they form an array of beam-shaping elements. Preferably, at least one light source of the illumination device is assigned to each optical beam-shaping element.

It is possible to bridge the gap between the light sources and the illuminated areas very efficiently, due to the light concentration of the beam-shaping device (e.g. by means of a lens or a light guide, e.g. a glass fibre). Preferably, the beam-shaping device has an extent in the direction along the display area or the substrate which is greater than that of a light source, particularly preferably the extent is as great as the distance between the centroids of adjacent illuminated areas.

In a further display device according to the invention, each of the optical beam-shaping devices has an optical collimator.

The light from the light source can hereby be collected and guided in a direction. For example, a collimator film (microprism film, micropyramid film, microsphere film) and/or a (parabolic/elliptical) reflector, with the light source preferably at the focal point, and/or (micro) lenses (Fresnel or conventional), are provided as a collimator, or generally a collimating reflective or transmissive optical system. A collimator is preferably set up to reduce the angle of radiation of a light source of the illumination device via beam deflection towards the optical axis.

In a further display device according to the invention, each of the optical beam-shaping devices has an optical concentrator.

By this part of the beam-shaping device, the light is effectively concentrated onto the illuminated area. For example, a (customarily non-imaging) compound parabolic concentrator (CPC) is provided as concentrator, and/or photonic crystals or generally a focussing or concentrating reflective or transmissive optical system such as e.g. also an (imaging or non-imaging) capacitor or Fresnel lens. Preferably, the concentrator is a non-imaging optical system, whereby a higher efficiency of concentration and a homogenization of intensity can be achieved. The input of the optical concentrator facing the illumination device preferably has a larger area (e.g. 80 μm in diameter or in diagonal) than the output of the optical concentrator facing an illuminated area (e.g. 8 μm in diameter or in diagonal). This applies preferably to each optical concentrator. Preferably, the input has a surface which is formed to be as large and uniform as the light-emitting surfaces of the light source(s) assigned to the concentrator. Light from a larger entry area is hereby concentrated onto a small illuminated area. Preferably, the concentrator has an input and an output. Preferably, the input has a larger area than the output. Preferably, the output faces the illuminated area and the display area and the input faces the illumination device. The concentrator preferably has an optical input angle which is at most 30°, preferably at most 10° smaller than the optical output angle of the collimator. Particularly preferably, the optical input angle of the concentrator is equal to or greater than the output angle of the collimator.

In a further display device according to the invention, the optical collimator is arranged in front of the concentrator, with respect to a propagation direction of the light from the illumination device, with the result that light can first be substantially collimated and then concentrated.

A particularly effective beam shaping is hereby possible. Particularly preferably, optical collimator and optical concentrator are combined in one element. Light-scatter losses can hereby be minimized.

In a further display device according to the invention, the optical beam-shaping devices have at least one curved or stepped reflector surface.

The light can be guided onto the illuminated areas through curved or stepped reflector surfaces with an enormously increased degree of effectiveness, in particular by taking advantage of the phenomenon of total reflection. Preferably these are parabolically or elliptically curved surfaces (e.g. of a CPC) or a facet mirror.

In a further display device according to the invention, at least one functional element is arranged between the illumination device and the display area. Furthermore, in a further display device according to the invention, the at least one functional element is arranged between at least two optical beam-shaping devices, preferably in the space between two optical beam-shaping devices.

The aforementioned arrangements enable the space between the illumination device and the display area and between at least two optical beam-shaping devices to be used for the at least one functional element. Because of this, it is possible to limit the construction height and thus save on a construction layer for e.g. a functional element. As a result, the height and weight of the display device to be formed with at least one functional element are reduced.

In a further display device according to the invention, the at least one functional element which is arranged between two optical beam-shaping devices has a polygonal or polyhedral shape, wherein the polygonal or polyhedral shape increases the surface area of the non-illuminated area between two illuminated areas. Due to the enlargement of the surface area, a larger area is available, for example for a solar element which serves to convert solar energy into electrical energy. Because of the enlarged surface area, more energy can be generated or converted, which means that the efficiency of a display device with at least one functional element is increased.

Self-evidently, it is possible that a plurality of different functions, such as e.g. a temperature sensor, a distance sensor, a pressure sensor, a gas sensor and/or an image sensor are combined in the at least one functional element.

In a further display device according to the invention, it is possible that the above-described properties and advantages of the functional element are combined in a single illuminated area together with a light source. This means that a functional element and a light source share an illuminated area, which makes a further miniaturization possible. Consequently, both a sensor and also a light source can be assigned to an illuminated area. The above-described features and advantages of the light source, the illuminated area and the functional element can be applied analogously in this display device according to the invention.

Furthermore, the object of the invention is achieved in particular by a method for the representation of an image on a display device, wherein a display device according to the invention is used.

Figure 2:
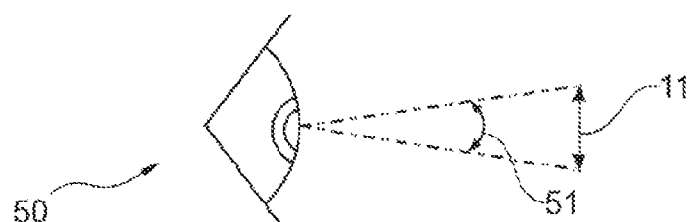
Figures 3A, 3B:
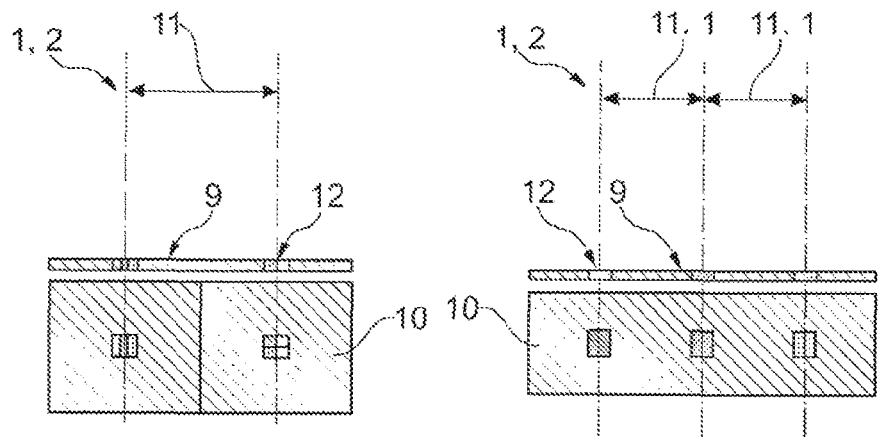

The invention will now be further explained by way of example using drawings. There are shown in:

FIG. 1 an enlarged section of a display device according to the invention, in which the proportion of non-illuminated areas on the display area is more than 70%, FIG. 2 a purely qualitative illustration of a distance which is smaller than the resolving power of the viewer and which appears for the viewer at an angle of at most two angular minutes, FIGS. 3a and 3b sections of display devices according to the invention building on FIG. 1, wherein the display device is a colour display device, FIGS. 4a to 6d show the two-dimensional structure of a display area according to the principle according to the invention, to provide a proportion of non-illuminated areas in the entire display area of more than 70%, can be obtained in different ways, wherein FIGS. 4a to 4e show sections of display devices according to the invention building on FIG. 3a or 3b, wherein the display device has an illumination device with a substrate, on which a plurality of light sources are arranged, wherein the light sources are preferably small light sources (e.g. VCSEL lasers), i.e. preferably light sources in which the surface area of the active illuminated area is smaller than or equal to the surface area of the corresponding illuminated area, and wherein FIGS. 5a to 6d show sections of display devices according to the invention building on FIG. 3a or 3b, wherein these have light sources which are larger in comparison with FIGS. 4a-4e and in particular in each case optical beam-shaping devices which are arranged between the illumination device and the display area, and wherein one illuminated area is assigned to each beam-shaping device and each of the beam-shaping devices is set up to concentrate light from the illumination device onto the respective illuminated area.

Figure 7:
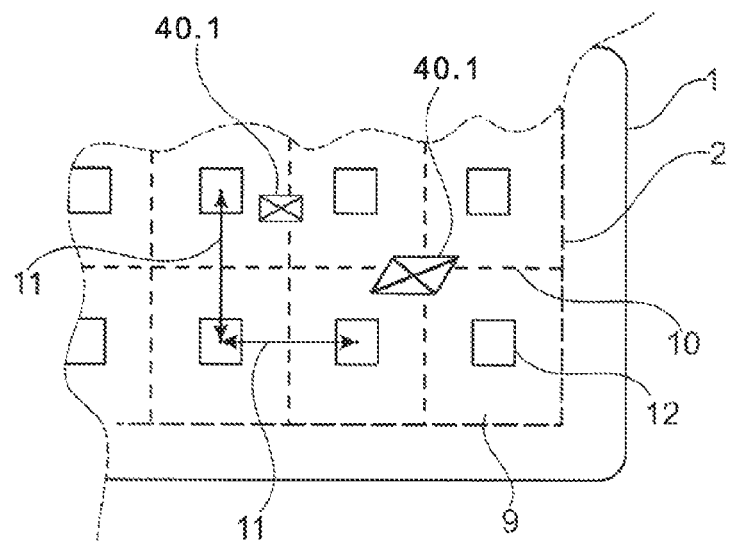
Figures 8A, 8B:
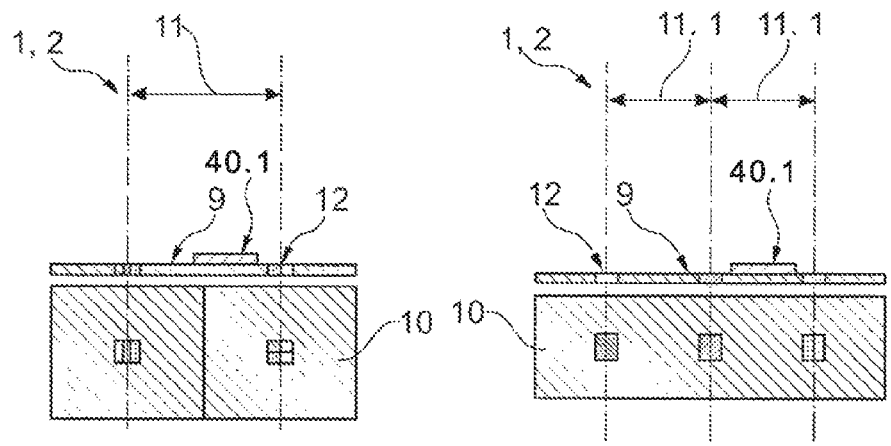
Figure 9A:
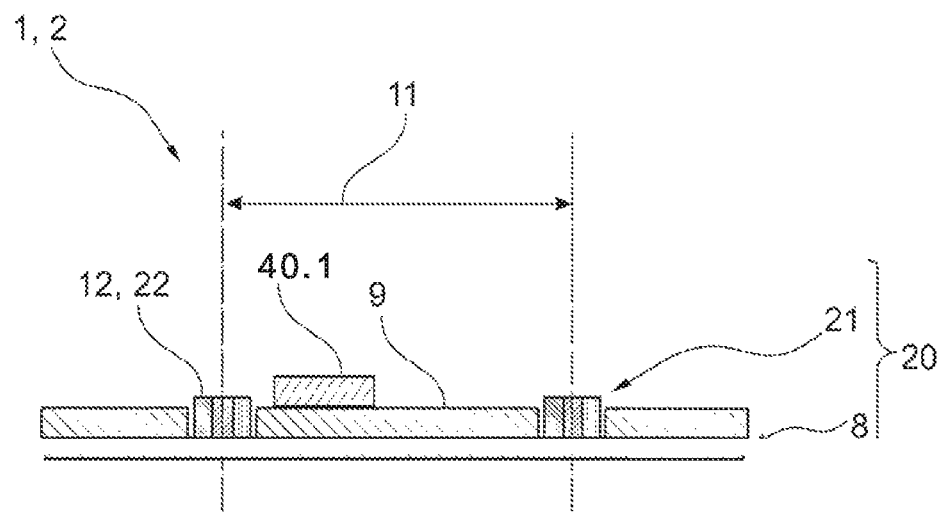
Figure 9B:
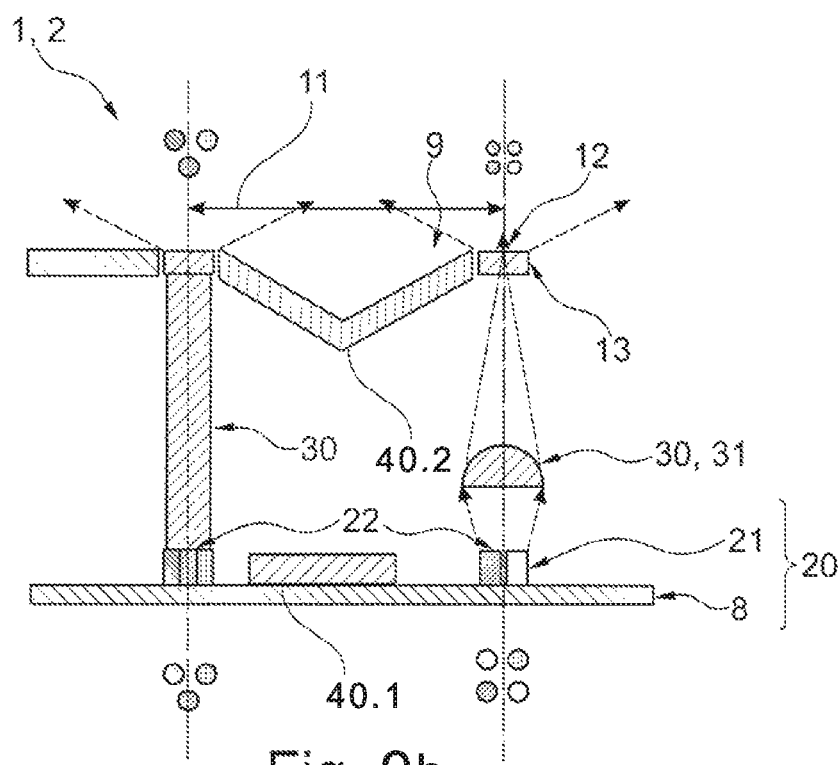
Figure 9C:
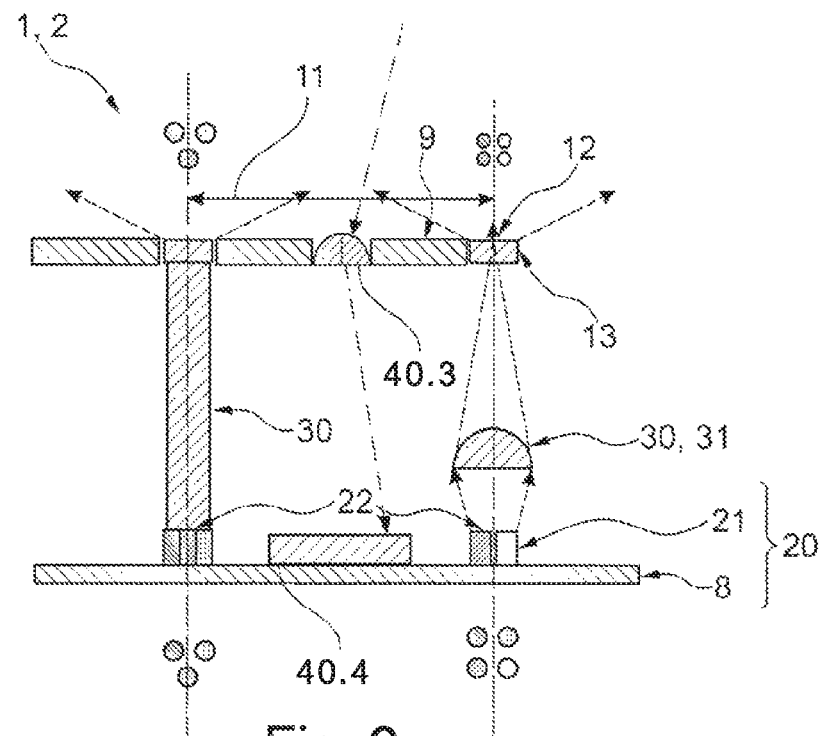
Figure 10:
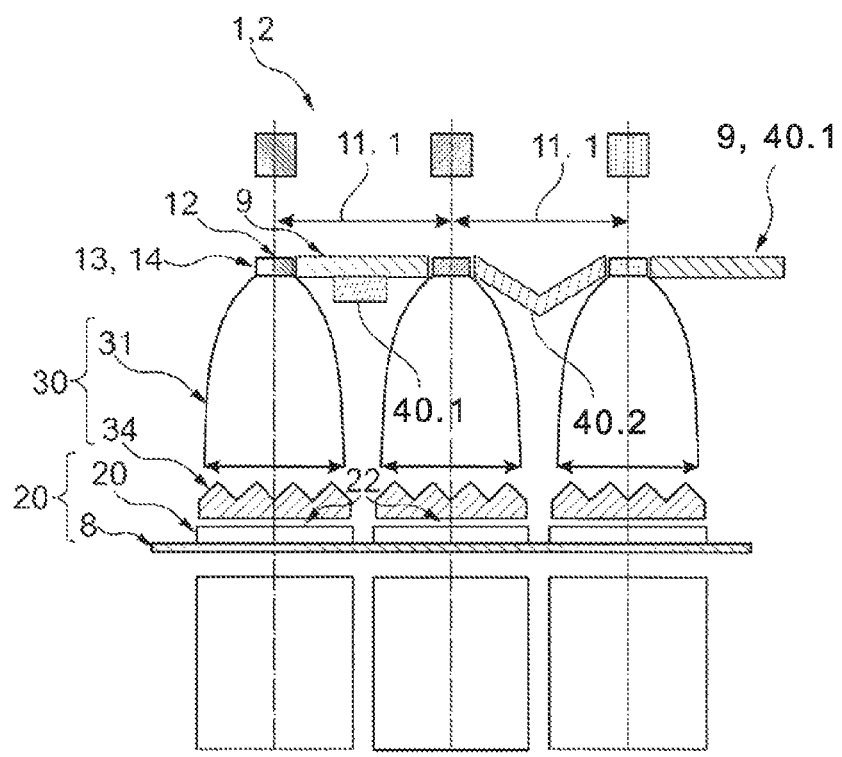

FIG. 7 the enlarged section cut of a display device according to the invention from FIG. 1, supplemented by functional elements, FIGS. 8a and 8b section cuts of display devices according to the invention from FIGS. 3a and 3b, each with a functional element, FIGS. 9a, 9b and 9c FIG. 4a and FIG. 4d, twice, supplemented by functional elements, and FIG. 10 FIG. 5d with functional elements.

FIG. 1 shows an enlarged section of a display device 1 according to the invention, in which the proportion of non-illuminated areas 9 in the entire display area 2 is more than 70%. Display device 1 has a display area 2 (boundary=dashed line with the longest dashes) which consists of non-illuminated areas 9 and illuminated areas 12. The centroids of adjacent illuminated areas 12 have distances 11 from each other which are smaller than the resolving power of a viewer. This example also shows that one or more illuminated areas 12 are assigned to a pixel 10 (pixel boundary=dashed line with middle-length dashes) and the display area 2 has a plurality of such pixels 10 which are arranged in a repeating pattern, with the result that images can be composed from pixels 10.

A great advantage is that the illuminated areas 12 are separated from each other by large separating sections which are formed by non-illuminated areas 9, and thus on the one hand, no scattered light from one illuminated area 12 to the other occurs (or this is greatly reduced) and that, on the other hand, dark regions of an image represented by the display device 1 can appear even darker as the non-illuminated areas 9 predominate.

FIG. 2 shows a purely qualitative illustration of a distance 11 which is smaller than the resolving power of the viewer 50 and which appears for the viewer at an angle 51 of at most two angular minutes. With such a distance 11, most viewers 50 can no longer perceive two different pixels 10 and they thus receive a particularly high quality and continuous image impression.

For reasons of space, the subsequent Figures also show various embodiment possibilities within a display device 1, which is not to be considered limiting. These mean that the corresponding display device preferably has only one form of the shown embodiment possibilities (applied to all illuminated areas/pixels) or a mixture of different embodiment possibilities (e.g. as then shown).

FIGS. 3a and 3b show sections of display devices 2 according to the invention building on FIG. 1, wherein the display device 1 is a colour-display device. In each case, a side view is shown above a top view of the display area 2. However, hatchings are used here to distinguish between colours and to provide a better illustration.

Two pixels 10 are shown in FIG. 3a. In each case an illuminated area 12 is assigned to a pixel 10, wherein a plurality of colours are emitted towards the viewer via the illuminated area 12. Two possibilities for the composition of a pixel 10 are shown, on the left-hand side a composition of a pixel 10 from the colours red (narrow hatching from top left to bottom right), green (narrow hatching from bottom left to top right), blue (narrow vertical hatching) preferably in strip arrangement and to the right from the colours red, green, blue and white (without hatching) preferably in approximately square arrangement. Components with a broad hatching from top left to bottom left, as here the non-illuminated areas 9, are preferably light resistant.

In FIG. 3b there is shown a pixel 10 to which three illuminated areas 12 are assigned, wherein red can be emitted to the viewer via a first illuminated area 12, green can be emitted to the viewer via a second illuminated area 12 and blue can be emitted to the viewer via a third illuminated area 12. The distances 11.1 between the centroids of adjacent illuminated areas 12 are ⅓ of the distance 11 which is smaller than the resolving power of the viewer 50.

FIGS. 4a to 7b show how the two-dimensional structure of a display area 2 according to the principle according to the invention, to provide a proportion of non-illuminated areas 9 in the entire display area 2 of more than 70%, can be obtained in different ways. Optical axes are in each case drawn in with dash-dotted lines and partially a preferred light pattern or colour of the corresponding light source 21 is indicated at the bottom end of the axis, and a preferably resulting light pattern or colour on the illuminated area 12 at the top end of the axis.

Figure 4A:
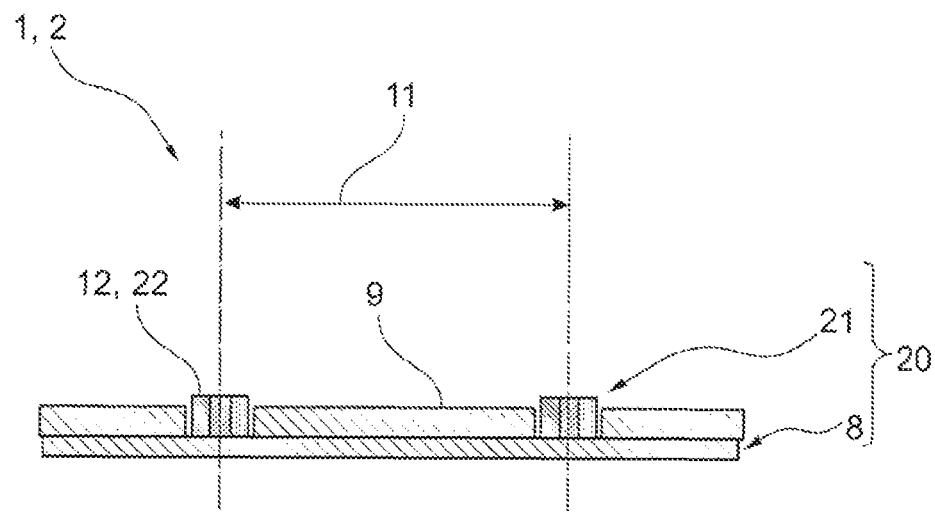
Figure 4B:
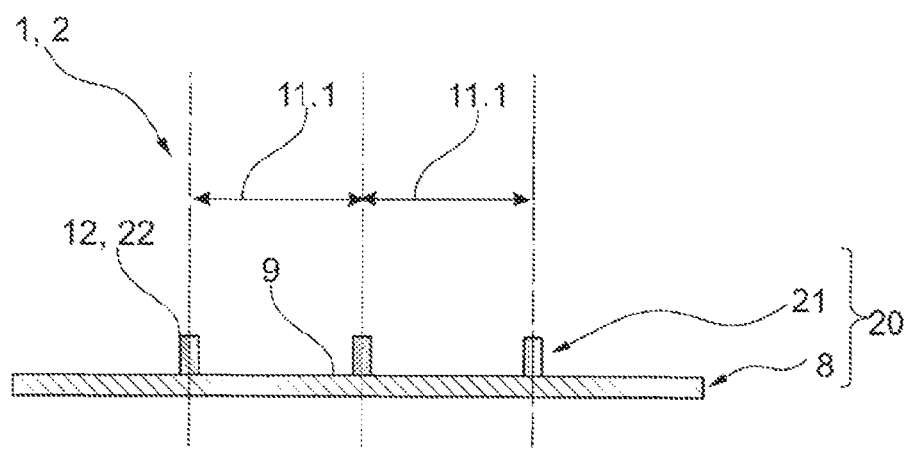
Figure 4D:
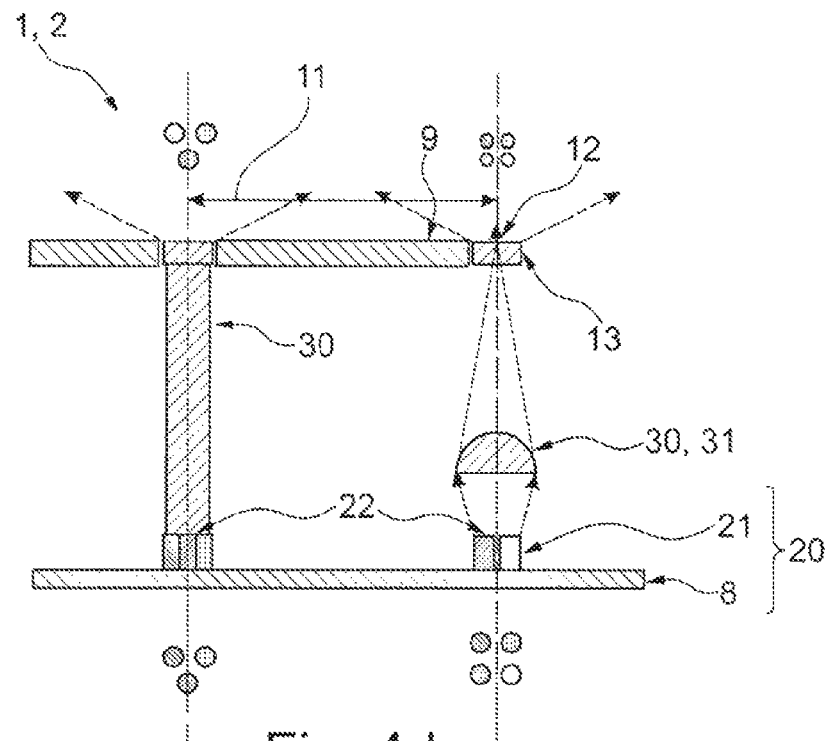
Figure 4C:
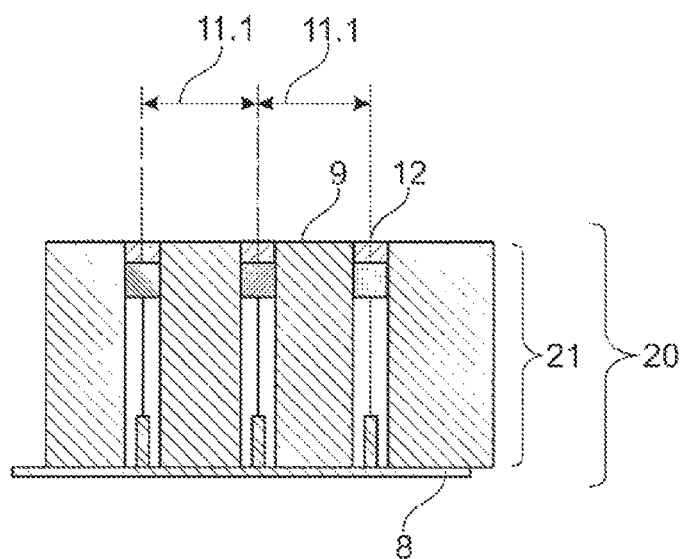
Figure 4E:
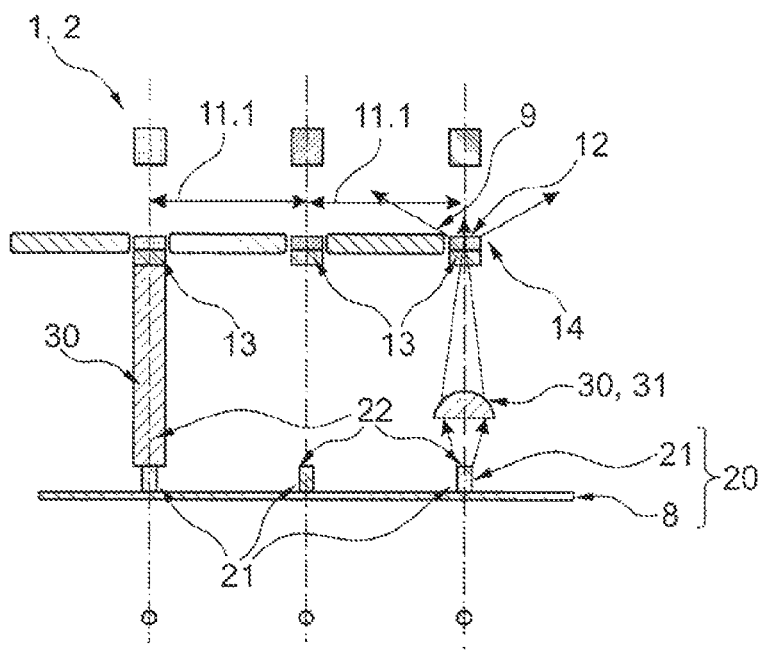

FIGS. 4a to 4e show section cuts of display devices 1 according to the invention building on FIG. 3a or 3b. The display device 1 has an illumination device 20 with a substrate 8 on which a plurality of light sources 21 are arranged, wherein preferably the light sources 21 are small light sources 21 (e.g. VCSEL lasers), i.e. preferably light sources 21 in which the surface area of the active illuminated area 22 is smaller than or equal to the surface area of the corresponding illuminated area 12. FIGS. 4a and 4d show light sources 21 which are polychromatic, i.e. which are set up to emit different, variable proportions of light with different wavelengths, e.g. red, green, blue proportions. FIGS. 4b, 4c and 4e show light sources 21 which are monochromatic, i.e. which emit a non-variable wavelength range or fixed mix of different wavelengths.

In FIG. 4a, the illuminated areas 12 are each formed by one of the light sources 21. The non-illuminated areas 9 of the display area 2 are formed by areas of a filling material between the light sources 21, which could just as well also be provided like this in FIG. 4b. In FIG. 4b, the illuminated areas 12 are each formed by one of the light sources 21. The non-illuminated areas 9 of the display area 2 are formed by areas of substrate 8, which could just as well also be provided like this in FIG. 4a. In FIGS. 4a and 4b the active illuminated area 22 of the respective light source 21 is thus similarly an illuminated area 12 of the display area 2. With fewer components, a display device can thus be produced, wherein, however, advantageously qualitatively very high-quality, bright and precisely dimensioned light sources are intended to be used for this.

In FIG. 4c, the illuminated areas 12 are each formed by a transparent cover element which can be illuminated by one of the light sources 21. The non-illuminated areas 9 of the display area 2 are formed by areas of a filling material between the light sources 21. Each light source 21 has a layer of luminescent material and an electron emitter which is set up to cause the layer of luminescent material to actively light up by emitting an electron beam. The layer of luminescent material can also be considered a scatter element, as it distributes the radiation energy arriving from one direction into a plurality of directions. Between the electron emitter and the layer of luminescent material there is in each case a vacuum in a vacuum cell.

An advantage of this is that, because of the inventive principle of a large intermediate area between the illuminated areas, a very good and favourable sealing of the vacuum cells is also possible.

In FIG. 4*d* the illuminated areas 12 are each formed by an optical scatter element 13 (broad hatching from bottom left to top right—this type of hatching preferably means that the thus hatched component, e.g. also later lenses, is transparent, preferably substantially without colour filtering) which can be illuminated by one of the light sources 21. The non-illuminated areas 9 of the display area 2 are formed by surfaces of a filling material between the light sources 21, at the height of the scatter elements 12. Two embodiment possibilities are shown, on the left with a so-called light guide (e.g. a glass fibre) as beam-shaping device 30, which also serves as concentrator 31; on the right with a lens as concentrator 31. The resulting light pattern on the illuminated area 12 is shown as above, on the left approximately at the same size as the light pattern of the illuminated area 22, on the right somewhat smaller. Additionally, the resulting light pattern is more diffuse, preferably with colours thoroughly mixed together, which takes place because of the scatter element 13, but which cannot be advantageously represented by a technical drawing. Because of this, a scattered radiation is achieved, but simultaneously a bundling of light onto the scatter elements 13.

In FIG. 4*e* the illuminated areas 12 are each formed by an optical colour-filter element 14 which can be illuminated by one of the light sources 21. The non-illuminated areas 9 of the display area 2 are formed by surfaces of a filling material between the light sources 21, at the height of the colour-filter elements 14. Each light source 21 has a UV emitter which is set up, by emitting a UV light beam, to cause a layer of luminescent material, which here e.g. also acts as scatter element 13, to actively light up. The different colours, here RGB, are thus received through the colour-filter elements 14, e.g. by quantum dots. Furthermore, three embodiment possibilities are shown, on the left and on the right beam-shaping elements 30, as in FIG. 4*d*, and in the centre, a variant without beam-shaping element 30.

Figure 6A:
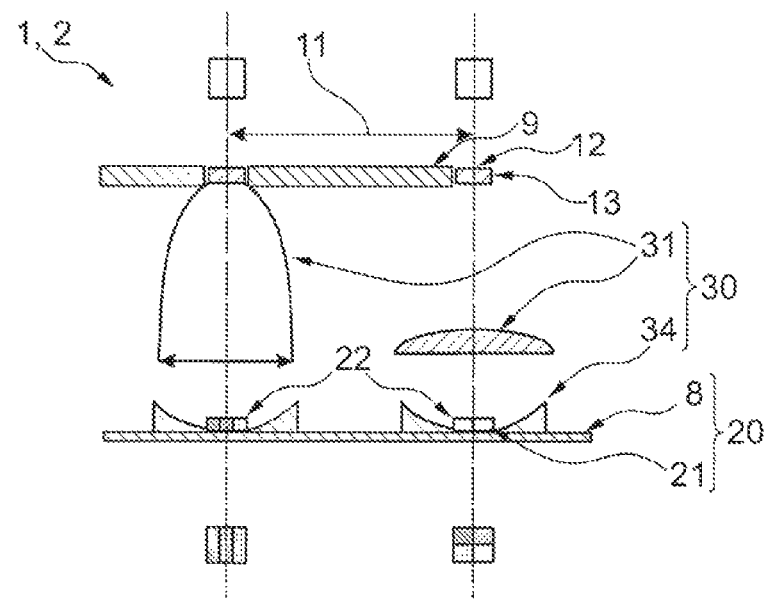

Preferably, in FIGS. 4*d* and 4*e*, a collimator 34 is part of the beam-shaping device 30, analogously e.g. to FIG. 6*a*.

FIGS. 5*a* to 6*d* show sections of display devices 1 according to the invention, building on FIG. 3*a* or 3*b*. Compared with FIGS. 4*a*-4*e*, these have larger light sources 21, and in particular in each case optical beam-shaping devices 30 which are arranged between the illumination device 20 and the display area 2, and an illuminated area 12 is assigned to each beam-shaping device 30, and the beam-shaping devices 30 are in each case set up to concentrate light from the illumination device 20 onto the respective illuminated area 12. The active illuminated areas 22 of the light sources 21 each have a surface area which is greater than the respective surface area of the illuminated area 12 of the display area 2. The display devices 1 each have optical beam-shaping devices 30 which are arranged between the illumination device 20 and the display area 2, and an illuminated area 12 is assigned to each beam-shaping device 30, and the beam-shaping devices 30 are in each case set up to concentrate light from the illumination device 20 onto the respective illuminated area 12. Each of the optical beam-shaping devices 30 has an optical collimator 34 (e.g. a hemispherical collimator lens) and an optical concentrator 31 with curved reflector surfaces, and each optical collimator 34 is arranged in front of the concentrator 31 with respect to a propagation direction of the light from the illumination device 20, with the result that light can first be substantially collimated and then concentrated. As concentrator 31, on the one hand a compound parabolic concentrator (CPC) is provided (represented by two opposing curved, preferably parabolically curved reflector surfaces and also shown in perspective in FIG. 5*c*); alternatively, a condenser lens 31 (e.g. on the right of FIG. 6*a*). As collimators 34, on the one hand, prism collimators 34 (indicated by a pyramid structure), or alternatively reflectors 34 (as in FIG. 6*a* to FIG. 6*d*) are present.

Figure 5A:
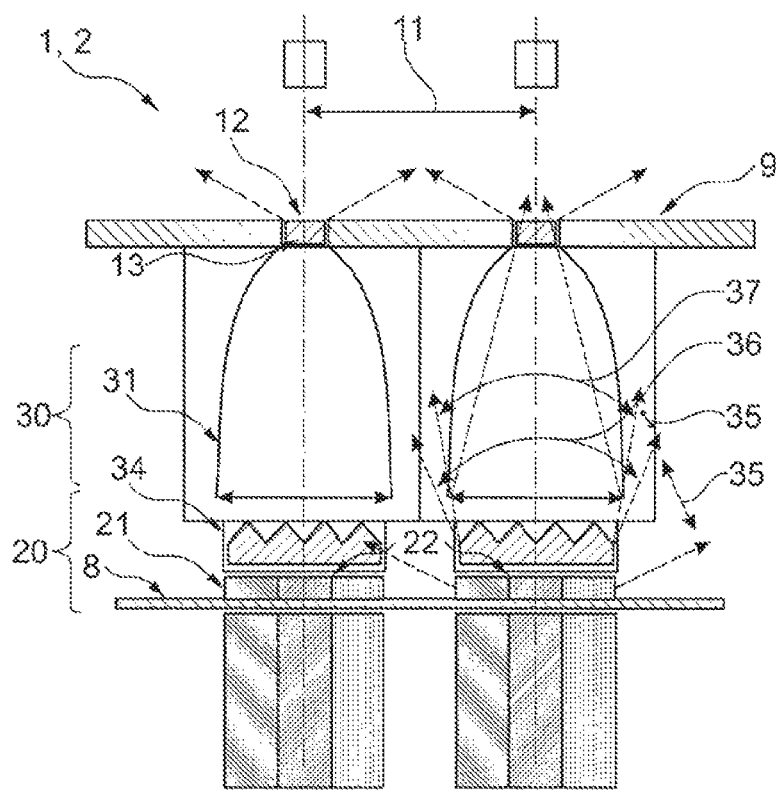

In FIGS. 5*a*, 5*b* and 5*d* the display devices 1 have light sources 21 which are approximately Lambertian radiators. In FIG. 5*a*, each illuminated area 12 is formed by an optical scatter element 13 which can be illuminated by the illumination device 20. The non-illuminated areas 9 of the display area 2 are formed by surfaces of a filling material arranged between the scatter elements 13, wherein the filling material is shown here as an area, but can just as well also completely fill the intermediate space between adjacent beam-shaping elements 30. The light sources are polychromatic and the light sources or the active illuminated areas thereof have an extent which is more than 50% of the distance 11 between the centroids of the illuminated areas 12. The CPCs 31 have an input 32 and an output 33 (see also FIG. 5*c*), wherein the input 32 has a larger surface area than the output 33 and the output 33 faces the illuminated area 12 and the display area 2, and the input 32 faces the illumination device 20. The CPC has an optical input angle 37 which is at most 30°-10°, preferably 20°, smaller than the optical output angle 36 of the prism collimator 34. Thus optical losses 35 can be minimized so far as possible. An effective light concentration onto the illuminated areas 12 takes place due to the combination of collimator 34 and concentrator 31. Additionally, a very homogeneous colour mixture is achieved by the CPC as a non-imaging optical system, which is indicated by the white output light pattern. The scatter element 13 allows a large viewing angle. The beam path of the light is indicated by dashed arrows. In FIG. 5*b*, a variant of the display device from FIG. 5*a* is shown, in which the extent of the light source 21 is smaller than 50% of the distance 11, but greater than the extent of the illuminated area 12. In FIG. 5*d*, unlike FIG. 5*a*, the light sources are monochromatic and the illuminated areas 12 are each formed by an optical colour-filter element, which is simultaneously a scatter element 13, which can be illuminated by the illumination device 20. Furthermore, distances 11.1 result between the illuminated areas 12 which are one third of the distance 11.

Figure 6B:
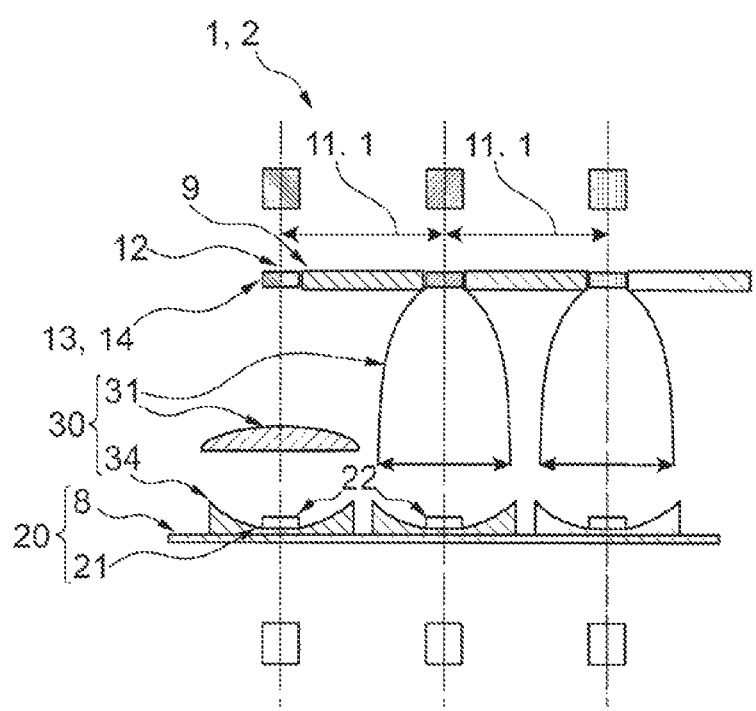
Figure 6C:
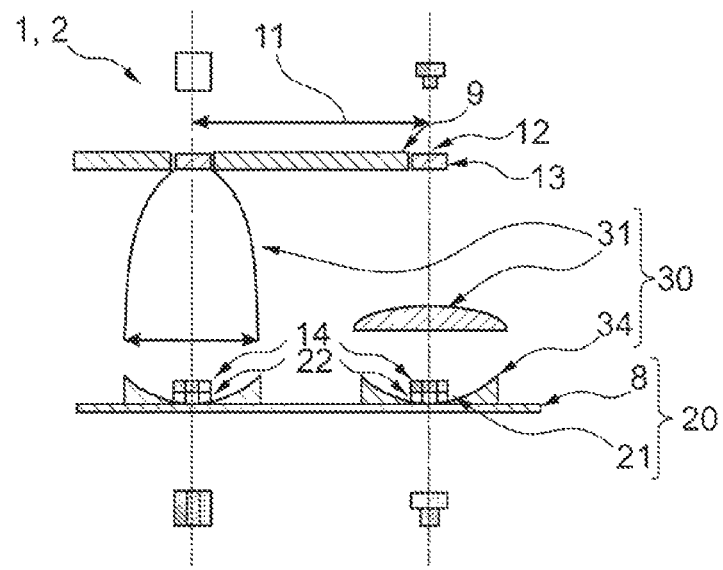
Figure 6D:
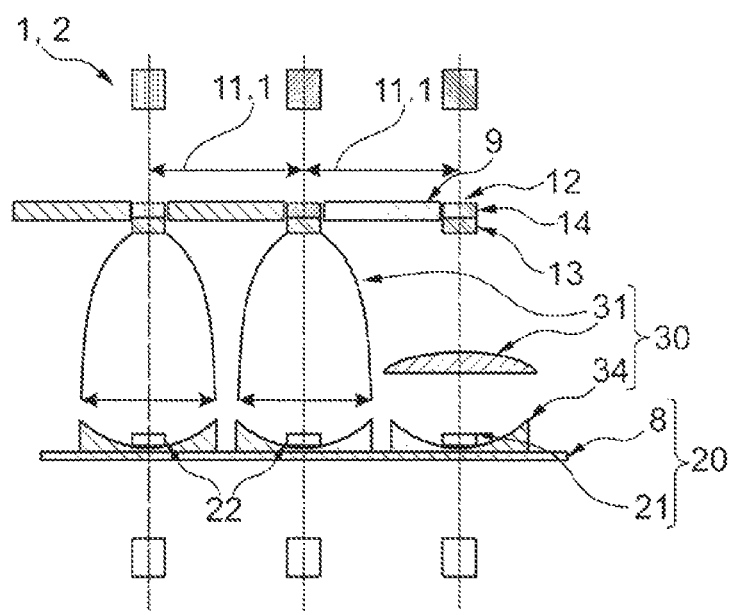

In FIGS. 6*a*, 6*b*, 6*c* and 6*d*, the display devices 1 have light sources 21 which, in terms of area (e.g. relative to the active illuminated area of a light source) are the same size as or larger than the illuminated areas 12. Otherwise, FIG. 6*a* is similar to FIG. 5*a*, wherein, unlike FIG. 5*a*, FIG. 6*a* shows collimators 34 which surround the light sources 21 as parabolic reflector. The optical collimator 34 is still arranged in front of the concentrator 31 with respect to a propagation direction of the light from the illumination device 20, with the result that light can first be substantially collimated and then concentrated. As a variant, an RGBW light source is shown on the right, as well as a condenser lens instead of a CPC as a concentrator 31, here a non-imaging condenser lens, which likewise brings about a good homogenization of the light transmitted through the illuminated area 12. FIG. 6*b* is similar to FIG. 6*a*, wherein the light sources 21 are monochromatic and each of the illuminated areas 12 is formed by an optical colour-filter element, which is simultaneously a scatter element 13, which can be illuminated by the illumination device 20. Furthermore, distances 11.1 result between the illuminated areas 12 which are one third of the distance 11. FIG. 6c is similar to FIG. 6a, wherein the light sources 21 are monochromatic, here white, and colour-filter elements 14 are arranged directly on the light sources 21. Furthermore, on the right, an embodiment possibility with an imaging condenser lens 31 is shown. FIG. 6d is similar to FIG. 6a, wherein the light sources 21 are monochromatic, here e.g. substantially blue- and/or UV-emitting. Each of the illuminated areas 12 is formed by an optical colour-filter element 14 which can be illuminated by the illumination device 20. Each light source 21 has a blue and/or UV emitter which is set up, by emitting a blue and/or UV light beam, to cause a layer of luminescent material, which here acts as a scatter element 13, to actively light up. The different colours, here RGB, are thus received through the colour-filter elements 14. Furthermore, distances 11.1 result between the illuminated areas 12 which are one third of the distance 11. Colour-filter elements 14 (e.g. quantum dots) are arranged directly on the light sources 21.

In respect of FIG. 7 reference is made to the description of FIG. 1, wherein FIG. 7 differs in that this also has functional elements 40.1. The functional elements 40.1 shown are arranged between the illuminated areas 12, or on the non-illuminated areas 9.

The arrangement and size of the functional elements 40.1 shown here is to be understood by way of example. Thus, functional elements 40.1 can be arranged in a repeating pattern, whereby a plurality of areas between illuminated areas 12 can be used. The size and shape of the functional elements 40.1 can also be varied. Self-evidently, any polygonal shape is also possible.

The functional elements 40.1 shown in FIG. 7 can e.g. be a solar element and/or a sensor. A sensor can, for example, be a temperature sensor, a distance sensor, a pressure sensor, a gas sensor or an image sensor. A solar element serves to convert solar energy into electrical energy, whereby the energy supply of the display device is extended or even initially made possible for example by charging a battery.

In respect of the description of FIGS. 8a and 8b, reference is made to the description of FIGS. 3a and 3b which can be applied here analogously. FIGS. 8a and 8b differ merely in terms of functional element 40.1 which is arranged on non-illuminated area 9. In FIGS. 8a and 8b, functional element 40.1 is attached to the top of display area 2. However, it is also possible to arrange the functional elements 40.1 on the bottom, thus on the side facing a viewer. In a specific case, functional element 40.1 is designed as a piezo element, more precisely as a pressure sensor. For example, an altimeter can be produced using the pressure sensor. Also, with a piezo element it is possible to generate haptic feedback in the form of vibration.

In respect of the description of FIG. 9a, reference is made to the figure description of FIG. 4a, which likewise applies here. Furthermore, FIG. 9a has a functional element 40.1 between two light sources 21 of illumination device 20. Functional element 40.1 is arranged on non-illuminated area 9 and designed as a gas sensor.

The description of FIG. 4d likewise applies to the description of FIG. 9b, wherein FIG. 9b is expanded by two functional elements 40.1 and 40.2. While a functional element 40.1 is arranged on substrate 8 of illumination device 20 between two light sources 21 and is designed as a capacitive sensor, the other functional element 40.2 forms a solar element. In order to enlarge the surface area of functional element 40.2 or of the solar element and thus increase the energy yield, functional element 40.2 has a polygonal shape. Also, the polygon-shaped, triangular functional element 40.2 forms the whole non-illuminated area 9 of display area 2 between two illuminated areas 12. Using the embodiment described above, a use of the space between optical beam-shaping devices 30, substrate 8 and illuminated areas 12 is possible in a simple manner, whereby a thin and weight-saving construction is achieved. Self-evidently, functional element 40.2 can also make use of only a part of non-illuminated area 9 of display area 2.

Furthermore, the description of FIG. 4d can also be applied analogously to the description of FIG. 9c, wherein FIG. 9c, as with FIG. 9b, has two functional elements, where functional element 40.3 is developed as a beam-shaping element and functional element 40.4 is developed as a beam-detection device.

Beam-shaping element 40.3, which is designed to be transparent and made from transparent material, is arranged between illuminated areas 12 and between non-illuminated areas 9 and steers light which is passing through by refraction onto beam-detection device 40.4. In this way, it is possible to design a plenoptic camera which can be formed by a plurality of functional elements 40.3 and 40.4. The available light of a scene which strikes the lens or beam-shaping element 40.3 from more than one direction is imaged onto beam-detection device 40.4 or an image sensor.

Distinct from a conventional camera, a plenoptic camera captures not only the position and intensity of a light beam which strikes an image sensor or beam-detection device 40.4, but also the direction from which the light beam arrives. A so-called light-field measurement can thus be undertaken. Consequently, using the embodiment, shown in FIG. 9c, it is possible to arrange a plurality of lenses or beam-shaping elements 40.3 in front of a plurality of image sensors or beam-detection devices 40.4 in a simple manner.

Advantages of a plenoptic camera are great depth of focus, no waiting for a focussing procedure to finish and a retroactive adaptation of the focus plane of a recorded object or image.

Beam-shaping element 40.3 is arranged between two illuminated areas 12 in FIG. 9c and designed hemispherical, but it can also take on another shape—depending on the application. For example, polygonal shapes are thus also possible. Beam-detection device 40.4 is arranged on substrate 8 and between two light sources 21, and in the present case a light-field sensor which—as described above—captures the position and intensity, but also the direction, of a light beam. An example of a light beam is shown with an broken dashed line, which strikes beam-shaping element 40.3, is broken by same and further steered to beam-detection device 40.4.

Furthermore, by means of the represented arrangement of functional elements 40.3 and 40.4, it is possible to produce a photocopy e.g. of an object, whereby the function of a normal camera can also be produced.

In respect of the description of FIG. 10, reference is made to the description of FIGS. 5a to 5d and in particular FIG. 5d, which can likewise be applied here. A functional element 40.1 is arranged below the left, non-illuminated area 9 of display area 2, wherein the right-hand non-illuminated area 9 is designed to be identical to FIG. 9b. In respect of the polygon-shaped functional element 40.2, for reasons of brevity, reference is made to the description of FIG. 9b, which can likewise be applied here. Left-hand functional element 40.1 is designed as a piezo element which can produce haptic feedback and simultaneously functions as a pressure sensor. An input of the user on display device 1 can thus be detected and simultaneously haptic feedback can be generated for the input which has taken place.

Self-evidently, it is possible for the embodiments of FIGS. 7 to 10 that a plurality of different functions, such as e.g. a gas sensor and a pressure sensor, are combined in one functional element.

In all the embodiments shown, preferably non-illuminated areas 9, preferably the entire display area 2, have a reflectance of diffuse reflection and/or of specular reflection of less than 50%. For this purpose, the non-illuminated areas 9 preferably have a dark colour or are black and/or they have a mean roughness index in the range from 0.2 µm to 1.0 µm and/or are coated by means of a anti-reflection coating. Preferably, an electronic compensation device is additionally present, by means of which a minimum brightness of the illuminated areas 12 can be set automatically for adapting the representation of black image pixels in dependence on the ambient brightness.

With this invention, a revolutionary improvement in the quality of display devices is achieved. The image quality is increased by the principle of designing the non-illuminated areas lying between the illuminated areas to be as large as possible, e.g. by the proportion of non-illuminated areas in the entire display area being at least 70%, since the contrast is hereby improved and a lot of energy can be saved, which is very important in particular for portable devices. Black image components will also remain black due to an additional provision of the non-illuminated areas with a low reflectance (specular or diffuse). In order to be able to make the bright image regions even brighter, and also to compensate for the loss in brightness by the reduction of the surface proportion of the illuminated areas, special intensive light sources (e.g. lasers or micro LEDs or micro OLEDS) are used, or a concentration of light onto the illuminated areas and thus a brightness boost is achieved by means of special beam-shaping devices which lie behind the display device, seen from the point of view of the viewer, with the result that the brightness mean value is similar to that of normal display devices, but with better contrast and lower energy consumption, depending on the ambient light.

REFERENCE NUMBERS

1 Display device
2 Display area of the display device
8 Substrate
9 Non-illuminated area
10 Pixel
11 Distance
11.1 ⅓ of distance 11
12 Illuminated area
13 Scatter element
14 Colour-filter element
20 Illumination device
21 Light source
22 Active illuminated area of the light source
30 Optical beam-shaping device
31 Optical concentrator
32 Input of the optical concentrator
33 Output of the optical concentrator
34 Optical collimator
35 Optical losses
36 Output angle of the optical collimator
37 Input angle of the optical concentrator
40.1 Functional element
40.2 Functional element/solar element
40.3 Functional element/beam-shaping element
40.4 Functional element/beam-detecting device
50 Viewer
51 Angle of incidence

The invention claimed is:

1. A display device including a display surface comprising non-light-emitting areas, which are at least 90% light resistant, and light-emitting areas, and
a substrate disposed underneath the display surface and on which a plurality of light sources is arranged, the display surface forming an outer surface of the display device, the total surface area of the light-emitting areas at the display surface forming less than 30% of the surface area of the entire display, wherein:
the centroids of adjacent light-emitting areas are separated by distances which are smaller than 190 um,
the diameter of each light emitting area at said display surface is less than 25 um,
each light emitting area forms a pixel of an image, and
the display device has at least one functional element.

2. The display device according to claim 1 wherein the centroids of adjacent illuminated areas are separated by at most 80 µm.

3. The display device according to claim 1 wherein the diameter of each light emitting area at said display surface is less than 10 um.

4. The display device according to claim 1, wherein at least one non-illuminated area has the at least one functional element.

5. The display device according to claim 1, wherein the at least one functional element is arranged between two illuminated areas.

6. The display device according to claim 1, wherein the at least one functional element is arranged between two light sources.

7. The display device according to claim 1, wherein the at least one functional element is arranged between two illuminated areas and between two light sources.

8. The display device according to claim 1, wherein the display device also has an illumination device with a substrate on which at least one light source and the at least one functional element are arranged.

9. The display device according to claim 1, wherein the at least one functional element is arranged between a non-illuminated area and a light source.

10. The display device according to claim 8, wherein the non-illuminated areas of the display area are formed by areas of the substrate, wherein the filling material has the at least one functional element.

11. The display device according to claim 8, wherein the non-illuminated areas of the display area are formed by areas of a filling material between the illuminated areas, wherein the filling material has the at least one functional element.

12. The display device according to claim 8, wherein the non-illuminated areas of the display area are formed by areas of a filling material between the illuminated areas and by areas of the substrate, wherein the filling material has the at least one functional element.

13. The display device according to claim 8, wherein the display device also has optical beam-shaping devices which are arranged between the illumination device and the display area, and wherein an illuminated area is assigned to each beam-shaping device, and each of the beam-shaping devices is set up to concentrate light from the illumination device onto the respective illuminated area.

14. The display device according to claim 8, wherein the at least one functional element is arranged between the illumination device and the display area.

15. The display device according to claim 13, wherein the at least one functional element is arranged between at least two optical beam-shaping devices.

16. The display device according to claim 15, wherein the at least one functional element is arranged in the space between said two optical beam-shaping devices.

17. The display device according to claim 13, wherein the at least one functional element, which is arranged between two optical beam-shaping devices, has a polygonal or polyhedral shape, wherein the polygonal or polyhedral shape increases the surface area of the non-illuminated area between two illuminated areas.

18. The display device according to claim 1, wherein the at least one functional element has a beam-shaping element and a beam-detection device, wherein the beam-shaping element steers light onto the beam-detection device.

19. The display device according to claim 1, wherein the at least one functional element has a solar element for converting solar energy into electrical energy.

20. The display device according to claim 19 further comprising a sensor.

21. The display device according to claim 20 wherein the sensor is a two-dimensional sensor.

22. The display device according to claim 20 wherein the sensor is a three-dimensional sensor.

23. The display device according to claim 20 wherein the sensor is an image sensor.

24. The display device according to claim 20 wherein the sensor is a touch-sensitive sensor.

25. The display device according to claim 20 wherein the sensor is a piezo element.

* * * * *